United States Patent
Kafuku et al.

(10) Patent No.: US 8,288,294 B2
(45) Date of Patent: Oct. 16, 2012

(54) INSULATING FILM FOR SEMICONDUCTOR DEVICE, PROCESS AND APPARATUS FOR PRODUCING INSULATING FILM FOR SEMICONDUCTOR DEVICE, SEMICONDUCTOR DEVICE, AND PROCESS FOR PRODUCING THE SEMICONDUCTOR DEVICE

(75) Inventors: Hidetaka Kafuku, Takasago (JP); Toshihito Fujiwara, Takasago (JP); Toshihiko Nishimori, Takasago (JP); Tadashi Shimazu, Kobe (JP); Naoki Yasuda, Kobe (JP); Hideharu Nobutoki, Tokyo (JP); Teruhiko Kumada, Tokyo (JP); Takuya Kamiyama, Suita (JP); Tetsuya Yamamoto, Suita (JP); Shinya Shibata, Suita (JP)

(73) Assignees: Mitsubishi Heavy Industries, Ltd., Tokyo (JP); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/001,256

(22) PCT Filed: Jun. 25, 2009

(86) PCT No.: PCT/JP2009/061659
§ 371 (c)(1),
(2), (4) Date: Mar. 8, 2011

(87) PCT Pub. No.: WO2010/001815
PCT Pub. Date: Jan. 7, 2010

(65) Prior Publication Data
US 2011/0266660 A1    Nov. 3, 2011

(30) Foreign Application Priority Data
Jun. 30, 2008 (JP) ................................ 2008-169847

(51) Int. Cl.
*H01L 21/31* (2006.01)

(52) U.S. Cl. ........................................ 438/778; 438/780
(58) Field of Classification Search .................. 438/778, 438/780
See application file for complete search history.

(56) References Cited

U.S. PATENT DOCUMENTS
6,458,719 B1    10/2002    Tsunoda et al.
(Continued)

FOREIGN PATENT DOCUMENTS
EP    2001045 A1    12/2008
(Continued)

OTHER PUBLICATIONS
International Search Report of PCT/JP2009/061659, mailing date Jul. 28, 2009.

*Primary Examiner* — Long Pham
(74) *Attorney, Agent, or Firm* — Westerman, Hattori, Daniels & Adrian, LLP

(57) ABSTRACT

An object is to provide an insulating film for a semiconductor device which has characteristics of a low permittivity, a low leakage current, and a high mechanical strength, undergoes less change in these characteristics with the elapse of time, and has an excellent water resistance, as well as to provide a process and an apparatus for producing the insulating film for a semiconductor device, a semiconductor device, and a process for producing the semiconductor device. A gas containing a raw material gas which gasified a predetermined alkylborazine compound is supplied in a chamber (2); an electromagnetic wave is introduced into the chamber (2) using with an inductive coupling type plasma generation mechanism (4, 5, 6) to convert the gas into a plasma; a substrate (8) is placed in a plasma diffusion region of the plasma; gas-phase polymerization is performed with borazine skeletal molecules, as a fundamental unit, dissociated from the alkylborazine compound by the plasma so as to form the insulating film for semiconductor devices on the substrate (8).

14 Claims, 8 Drawing Sheets

U.S. PATENT DOCUMENTS

| | | |
|---|---|---|
| 6,924,240 B2 | 8/2005 | Nobutoki et al. |
| 2005/0181628 A1 | 8/2005 | Nobutoki et al. |
| 2005/0202183 A1 | 9/2005 | Matsuda et al. |
| 2007/0224364 A1 | 9/2007 | Matsuda et al. |

FOREIGN PATENT DOCUMENTS

| | | |
|---|---|---|
| JP | 3508629 B2 | 3/2004 |
| JP | 2004-186402 A | 7/2004 |
| JP | 2006-032745 A | 2/2006 |
| JP | 2006-080538 A | 3/2006 |
| JP | 3778045 B2 | 5/2006 |
| JP | 3778164 B2 | 5/2006 |
| JP | 2007-266489 A | 10/2007 |
| JP | 2007-324536 A | 12/2007 |
| JP | 2008-311548 A | 12/2008 |
| WO | 2007/116644 A1 | 10/2007 |
| WO | WO2007116644 * | 10/2007 |

* cited by examiner

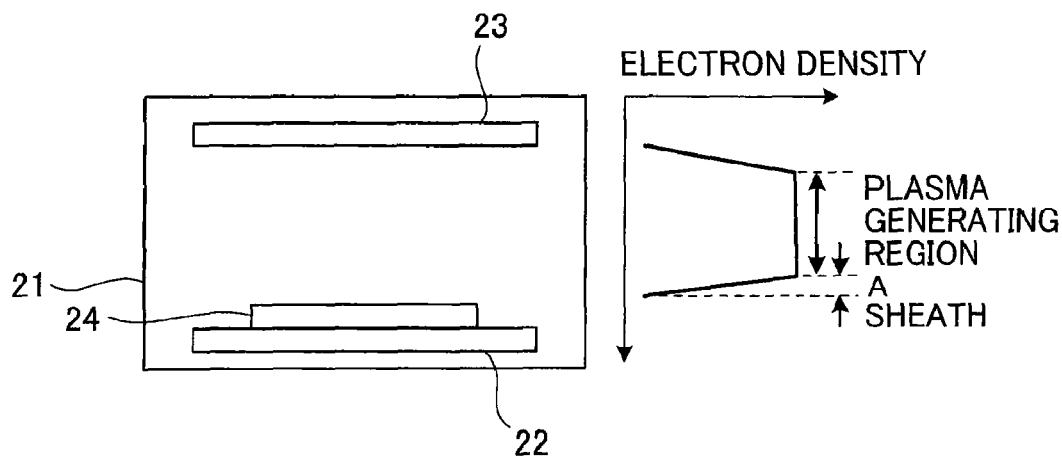
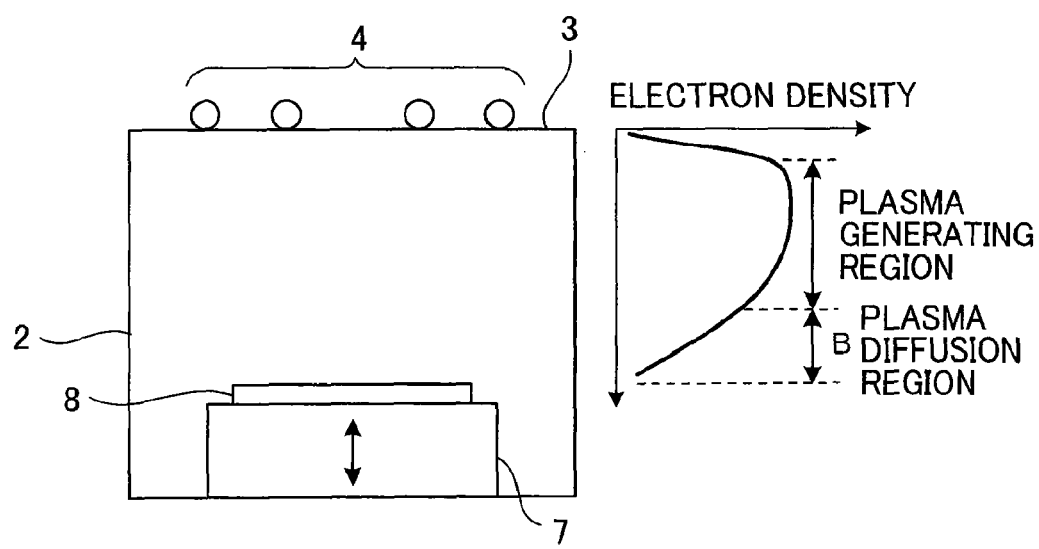

INSULATING FILM FOR SEMICONDUCTOR DEVICE, PROCESS AND APPARATUS FOR PRODUCING INSULATING FILM FOR SEMICONDUCTOR DEVICE, SEMICONDUCTOR DEVICE, AND PROCESS FOR PRODUCING THE SEMICONDUCTOR DEVICE

TECHNICAL FIELD

The present invention relates to an insulating film for a semiconductor device for use as an interlayer insulating film, an copper diffusion preventing film, an etch stopper layer, a passivation film, a hard mask, a high-stress film, or the like; a process and an apparatus for producing the insulating film for a semiconductor device; a semiconductor device using the insulating film for a semiconductor device; and a process for producing the semiconductor device.

BACKGROUND ART

Recently, along with development of information communication societies, the amount of information processing has been increased, and increase in the degree of integration and speed-up of LSIs (Large Scale Integrated circuits) which carry out the signal processing have been required. For the increase in the degree of integration and speed-up of the LSIs, miniaturization thereof is underway; however, along with the miniaturization, loss due to the capacity of an insulating layer between wirings has become a problem, and reducing the permittivity of the insulating layer has become necessary. As the insulating layer, in addition to the reduction in the permittivity, a high mechanical strength is required for processing of the LSIs. Moreover, although resistance of wiring is also reduced by changing the material of the wiring from an aluminum alloy to copper, a thin film such as a barrier film that contacts the wiring is also required to have a function to prevent diffusion of metal, particularly, copper, as well as to reduce the permittivity.

In view of the above-described problems, as the materials of the insulating layer of the next generation, various materials such as a fluorine-containing silicon oxide film (SiOF), a porous silicon oxide film, a fluorine-containing polyimide film, a porous organic coating film, and a SiC-based film have been studied.

However, when an interlayer insulating film is formed of SiOF, the permittivity of the interlayer insulating film is lower than that of conventional ones; however, since the permittivity thereof is about 3.2 to 3.5, reduction of the capacity between wirings, prevention of delay of signals propagation through wiring, and so on have not been sufficiently achieved.

Meanwhile, when an interlayer insulating film is formed of an organic compound material, a permittivity of 2.7 has been achieved by the film in which fluorine atoms are introduced to polyimide or by aryl ether-based polymers; however, it is not sufficient yet. A permittivity of 2.4 can be achieved by a vapor-deposited film of parylene; however, since obtained heat resistance is at most about 200 to 300° C., this restricts the manufacturing processes of semiconductor elements.

Meanwhile, the values of 2.0 to 2.5 have been reported as the permittivity of porous $SiO_2$ films; however, since the porosity thereof is high, there are problems that the mechanical strength (resistance to CMP polishing process) thereof is weak and the diameters of pores are varied.

Furthermore, since these polymer materials and the porous $SiO_2$ films have inferior heat conductivity than conventional $SiO_2$ interlayer insulating films, wiring life deterioration (electro-migration) due to increase in the wiring temperature has been concerned about.

Meanwhile, copper diffuses into these insulating films due to electric fields; therefore, when copper wiring is employed, the surface of copper has to be coated with a diffusion preventing film. Therefore, the upper surface and sidewalls of copper wiring are coated with electrically-conductive barrier metal, and the upper surface is coated with insulating silicon nitride. However, the permittivity of the silicon nitride film is about 7, and the resistance of the barrier metal is much higher than that of copper. As a result, the resistance value of the wiring as a whole increases; therefore, there has been a problem that speed-up of semiconductor devices is restricted.

Meanwhile, when a low-permittivity insulating film is used, a conventional silicon oxide film having good heat conductivity is used in each layer which has connecting holes to connect upper and lower wirings, in order to avoid reliability deterioration. Therefore, wiring capacity is further increased. The increase in the wiring capacity causes signal delay, and there has been a problem that speed-up of semiconductor devices is restricted.

As described above, the aforementioned insulating layer materials are not at levels enough to sufficiently satisfy all of the permittivity reduction, the high mechanical strength, and the function of preventing diffusion of metal, and still have many problems to be solved in a case where the insulating layer materials are applied as an insulating film, for example, low heat resistance and low heat conductivity.

Patent Document 1: Japanese Patent No. 3778164

DISCLOSURE OF THE INVENTION

Problems to be Solved by the Invention

As the materials having a low permittivity and a heat resistance that solve the above described problems, Patent Document 1 describes a low-permittivity material having borazine skeletal molecules in the molecules of an inorganic or organic material. However, the above described low-permittivity material has a hydrolytic property. Hence, there have been problems that expansion of the film and deterioration of the relative permittivity and leakage current are caused because of change with the elapse of time. Accordingly, techniques capable of stably manufacturing a thin film which has a borazine skeleton structure (6-membered ring structure) and which undergoes less change in these characteristics with the elapse of time have been required (hereinafter, the film having a borazine skeleton structure is referred to as a borazine skeletal structure film). In addition, in a case where a borazine compound having, as its side chain group, an alkyl group or the like containing carbon (C) is used as a raw material for forming the borazine skeletal structure film, techniques capable of not only reducing the amount of carbon in the borazine skeletal structure film, but also causing sufficient cross-linking reaction between borazine skeletal molecules in the borazine skeletal structure film have been required in order to obtain a lower leakage current and a lower permittivity.

The present invention has been made in view of the above described problems, and an object of the present invention is to provide an insulating film for a semiconductor device which has characteristics of a low permittivity, a low leakage current, and a high mechanical strength, undergoes less change in these characteristics with the elapse of time, and has an excellent water resistance, as well as to provide a process and an apparatus for producing the insulating film for a semiconductor device, a semiconductor device, and a process for producing the semiconductor device.

Means for Solving the Problems

A process for producing an insulating film for a semiconductor device according to a first invention to solve the above-mentioned problems comprises:

supplying a gas containing a raw material gas obtained by gasifying an alkylborazine compound represented by the following chemical formula 1 into a chamber;

causing plasma generating means of an inductively coupled type to radiate electromagnetic waves into the chamber, thereby converting the gas into a plasma state;

placing a substrate in a plasma diffusion region of the plasma; and performing gas-phase polymerization by using, as fundamental units, borazine skeletal molecules dissociated from the alkylborazine compound by the plasma, thereby forming a film on the substrate as the insulating film for a semiconductor device:

[Chemical Formula 1]

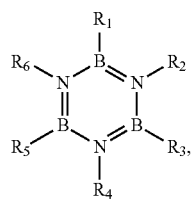

where R1 to R6 in the above chemical formula 1 are each a hydrogen atom or an alkyl group having 5 carbon atoms or less, and may be the same or different, except in a case where all R1 to R6 are hydrogen atoms.

A process for producing an insulating film for a semiconductor device according to a second invention to solve the above-mentioned problems has a feature in that, in the process for producing an insulating film for a semiconductor device as described in the first invention, at least one of R1, R3, and R5 in the alkylborazine compound shown in the above chemical formula 1 is a hydrogen atom.

A process for producing an insulating film for a semiconductor device according to a third invention to solve the above-mentioned problems has a feature in that, in the process for producing an insulating film for a semiconductor device as described in the first or second invention, the plasma generating means radiates the electromagnetic wave into the chamber from an antenna placed immediately above a ceiling plate of the chamber, and the substrate is placed at a position at which a distance from a lower surface of the ceiling plate is 5 cm to 30 cm.

A process for producing an insulating film for a semiconductor device according to a fourth invention to solve the above-mentioned problems has a feature in that, in the process for producing an insulating film for a semiconductor device as described in any one of the first to third inventions, the substrate is placed in a region where an electron temperature is 3.5 eV or less.

A process for producing an insulating film for a semiconductor device according to a fifth invention to solve the above-mentioned problems has a feature in that, in the process for producing an insulating film for a semiconductor device as described in any one of the first to fourth inventions, a gas containing at least one selected from the group consisting of ammonia and amine compounds each having an alkyl group having 1 to 3 carbon atoms is supplied into the chamber, along with the alkylborazine compound.

A process for producing an insulating film for a semiconductor device according to a sixth invention to solve the above-mentioned problems has a feature in that, in the process for producing an insulating film for a semiconductor device as described in any one of the first to firth inventions, after the insulating film for a semiconductor device is formed, the formed insulating film for a semiconductor device is treated with plasma mainly made from a gas not containing the alkylborazine compound.

A process for producing an insulating film for a semiconductor device, according to a seventh invention to solve the above-mentioned problems has a feature in that, in the process for producing an insulating film for a semiconductor device as described in any one of the first to sixth inventions, a bias is applied to the substrate.

A process for producing an insulating film for a semiconductor device according to an eighth invention to solve the above-mentioned problems has a feature in that, in the process for producing an insulating film for a semiconductor device as described in any one of the first to seventh inventions, the temperature of the substrate is set to 150° C. to 700° C., both inclusive.

A process for producing a semiconductor device according to a ninth invention to solve the above-mentioned problems comprises;

a wiring forming step of forming wiring on a substrate; and an insulating film forming step of forming an insulating film on the substrate by using the process for producing an insulating film for a semiconductor device according to any one of claims 1 to 8.

An apparatus for producing an insulating film for a semiconductor device according to a tenth invention to solve the above-mentioned problems comprises:

gas supplying means for supplying a desired gas into a chamber;

plasma generating means of an inductively coupled type for radiating electromagnetic waves into the chamber, thereby converting the gas into a plasma state;

placing means for placing the substrate at a desired position in the chamber; and controlling means for controlling the gas supplying means, the plasma generating means, and the placing means, wherein
the controlling means causes
the gas supplying means to supply a gas containing a raw material gas obtained by gasifying an alkylborazine compound represented by the following chemical formula 2 into the chamber,
the plasma generating means to convert the gas into a plasma state, and
the placing means to place the substrate in a plasma diffusion region of the plasma, and
a gas-phase polymerization is performed by using, as fundamental units, borazine skeletal molecules dissociated from the alkylborazine compound by the plasma, thereby forming a film on the substrate as the insulating film for a semiconductor device:

[Chemical Formula 2]

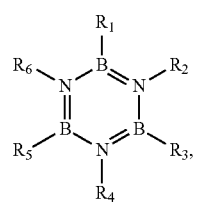

where R1 to R6 in the above chemical formula 2 are each a hydrogen atom or an alkyl group having 5 carbon atoms or less, and may be the same or different, except in a case where all R1 to R6 are hydrogen atoms are excluded.

An apparatus for producing an insulating film for a semiconductor device according to an eleventh invention to solve the above-mentioned problems has a feature in that, in the process for producing an insulating film for a semiconductor device as described in the tenth invention, the gas supplying means supplies the alkylborazine compound represented by the above-described chemical formula 2, in which at least one of R1, R3, and R5 is a hydrogen atom.

An apparatus for producing an insulating film for a semiconductor device according to a twelfth invention to solve the above-mentioned problems has a feature in that, in the process for producing an insulating film for a semiconductor device as described in the tenth or eleventh invention, the plasma generating means radiates the electromagnetic waves into the chamber from an antenna placed immediately above a ceiling plate of the chamber, and the placing means places the substrate at a position at which a distance from a lower surface of the ceiling plate is 5 cm to 30 cm.

An apparatus for producing an insulating film for a semiconductor device according to a thirteenth invention to solve the above-mentioned problems has a feature in that, in the process for producing an insulating film for a semiconductor device as described in any one of the tenth to twelfth inventions, the placing means places the substrate in a region where an electron temperature is 3.5 eV or less.

An apparatus for producing an insulating film for a semiconductor device according to a fourteenth invention to solve the above-mentioned problems has a feature in that, in the process for producing an insulating film for a semiconductor device as described in any one of the tenth to thirteenth inventions, the gas supplying means supplies the chamber with a gas containing at least one selected from the group consisting of ammonia and amine compounds each having an alkyl group having 1 to 3 carbon atoms, along with the alkylborazine compound.

An apparatus for producing an insulating film for a semiconductor device according to a fifteenth invention to solve the above-mentioned problems has a feature in that, in the process for producing an insulating film for a semiconductor device as described in any one of the tenth to fourteenth inventions, after the insulating film for a semiconductor device is formed, the controlling means generates plasma mainly made from a gas not containing the alkylborazine compound by use of the gas supplying means and the plasma generating means, and treats the formed insulating film for a semiconductor device with the plasma.

An apparatus for producing an insulating film for a semiconductor device according to a sixteenth invention to solve the above-mentioned problems further comprises, in the process for producing an insulating film for a semiconductor device as described in any one of the tenth to fifteenth inventions, bias applying means for applying a bias to the substrate, wherein a bias is applied to the substrate by the bias applying means.

An apparatus for producing an insulating film for a semiconductor device according to a seventeenth invention to solve the above-mentioned problems further comprises, in the process for producing an insulating film for a semiconductor device as described in any one of the tenth to sixteenth inventions, substrate temperature controlling means for controlling a temperature of the substrate, wherein the temperature of the substrate is controlled to be 150° C. to 700° C., both inclusive, by the substrate temperature controlling means.

An insulating film for a semiconductor device according to an eighteenth invention to solve the above-mentioned problems has a feature in that the insulating film is formed by using the process for producing an insulating film for a semiconductor device according to any one of the first to eighth inventions.

An insulating film for a semiconductor device according to a nineteenth invention to solve the above-mentioned problems has a feature in that, in the insulating film for a semiconductor device as described in the eighteenth invention, in infrared absorption measurement, a ratio [B1/A] is 0.05 or less, where A represents an absorption intensity at wave numbers of 1250 to 1450 $cm^{-1}$, and B1 represents an absorption intensity at wave numbers of 2400 to 2600 $cm^{-1}$.

An insulating film for a semiconductor device according to a twentieth invention to solve the above-mentioned problems has a feature in that, in the insulating film for a semiconductor device as described in the eighteenth or nineteenth invention, in infrared absorption measurement, a ratio [B2/A] is 0.1 or more, where A represents an absorption intensity at wave numbers of 1250 to 1450 $cm^{-1}$, and B2 represents an absorption intensity at wave numbers of 760 to 800 $cm^{-1}$.

An insulating film for a semiconductor device according to a twenty-first invention to solve the above-mentioned problems has a feature in that, in the insulating film for a semiconductor device as described in the eighteenth invention, in X-ray photoelectron spectroscopy, a ratio [C/(B+N+C)] is 35% or less, the ratio [C/(B+N+C)] being a ratio of a content of carbon atoms C with respect to a sum of contents of boron atoms B, nitrogen atoms N and carbon atoms C, of constituent elements in the film.

An insulating film for a semiconductor device according to a twenty-second invention to solve the above-mentioned problems has a feature in that, in the insulating film for a semiconductor device as described in the eighteenth invention, in grazing incidence X-ray analysis, an average density of the film is 1.5 $g/cm^3$ to 2.2 $g/cm^3$, both inclusive.

A semiconductor device according to a twenty-third invention to solve the above-mentioned problems comprises the insulating film for a semiconductor device as described in any one of the eighteenth to twenty-second inventions.

Effect of the Invention

The present invention makes it possible to obtain an insulating film for a semiconductor device which has characteristics of a low carbon content, a low permittivity, a low leakage current, and a high mechanical strength, and which undergoes less change in these characteristics with the elapse of time. By applying the insulating film for a semiconductor device having such characteristics to a semiconductor device, a highly integrated and high-speed semiconductor device can be achieved.

BRIEF DESCRIPTION OF THE DRAWINGS

FIG. 2 shows diagrams for describing placement positions of substrates with respect to plasma, where (a) is a schematic structural view of an apparatus having a plasma generation mechanism of a parallel flat plate type, and (b) is a schematic structural view of an apparatus having a plasma generation mechanism of an inductively coupled plasma (ICP)-type.

Figure 1:
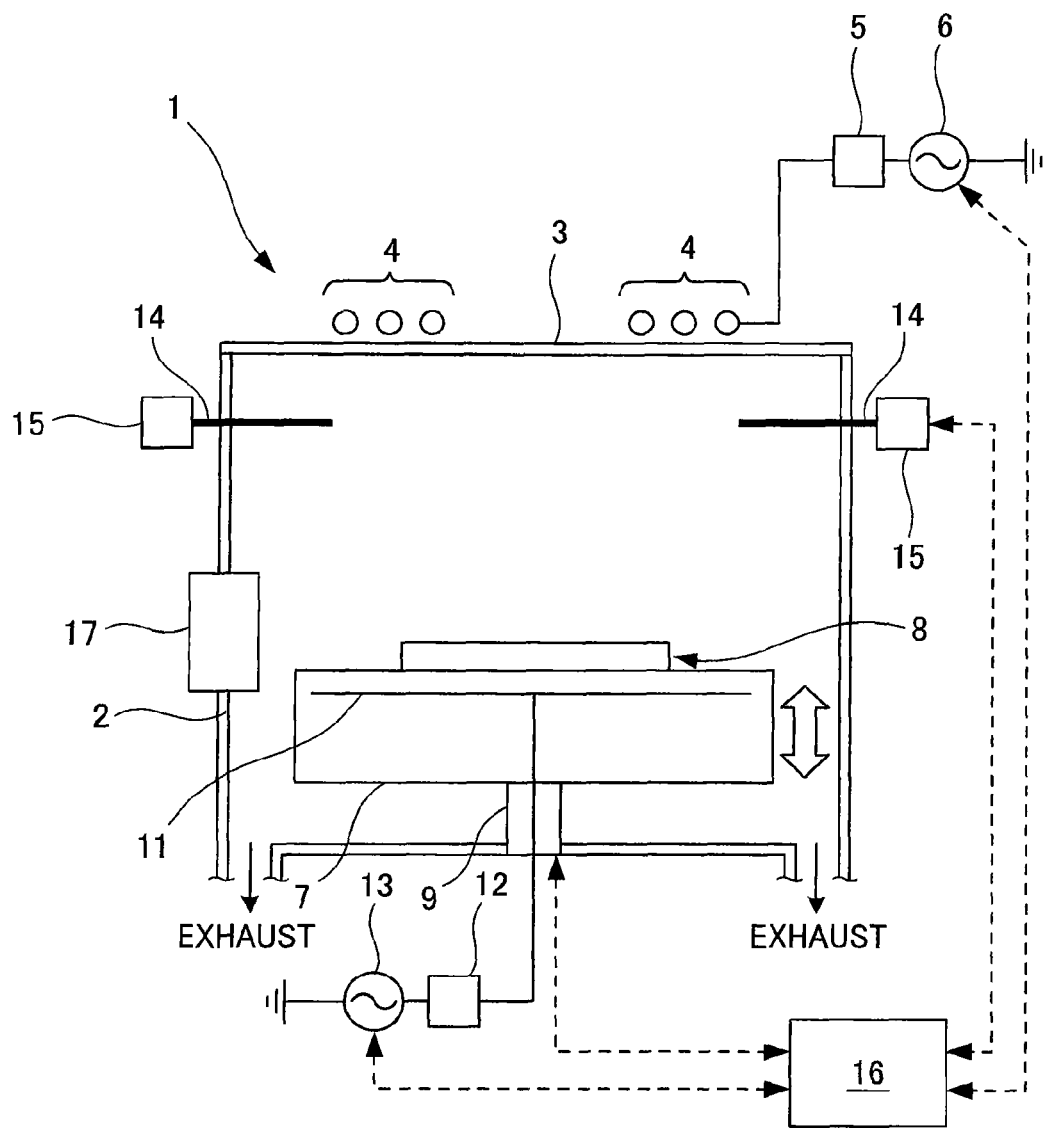
FIG. 1 is a transparent side view for describing an apparatus for producing an insulating film for a semiconductor device according to the present invention.

EXPLANATION OF REFERENCE NUMERAL 1 plasma CVD apparatus
2 vacuum chamber
3 ceiling plate
4 high-frequency antenna
5 matching box
6 high-frequency power source
7 support stage
8 substrate
9 lifting device
11 electrode
12 matching box
13 low-frequency power source
14 gas nozzle
15 gas controller
16 main controller
17 gate door

BEST MODES FOR CARRYING OUT THE INVENTION

Hereinafter, an insulating film for a semiconductor device and a process and apparatus for producing the same according to the present invention are described in detail with reference to FIGS. 1 to 9. Note that, FIG. 1 shows an ICP (inductively coupled plasma)-type plasma CVD apparatus 1 as an example, but any plasma CVD apparatus having a plasma generation mechanism of an inductively coupled type can be used.

First Embodiment

FIG. 1 is a transparent side view for describing an apparatus for producing an insulating film for a semiconductor device according to the present invention.

The plasma CVD apparatus 1 for the insulating film for a semiconductor device according to the present invention has a structure in which the inside of a cylindrical vacuum chamber 2 is used as a film forming chamber. In an upper opening portion of the vacuum chamber 2, a ceramic disk-shaped ceiling plate 3 is disposed to cover the opening portion.

In addition, a high-frequency antenna 4 formed of, for example, multiple circular rings is placed above (immediately above) the ceiling plate 3. To the high-frequency antenna 4, a high-frequency power source 6 is connected via a matching box 5 (plasma generating means). The high-frequency power source 6 can supply power to the high-frequency antenna 4 at an oscillation frequency (for example, 13.56 MHz) higher than that of a low-frequency power source 13 to be described later, and thereby can radiate electromagnetic waves for generating plasma in the vacuum chamber 2 through the ceiling plate 3. This is a structure of the so-called ICP-type plasma generation mechanism.

In addition, a support stage 7 is provided at a lower portion of the vacuum chamber 2. On an upper surface of the support stage 7, a substrate 8 of, for example, a semiconductor or the like is to be electrostatically attached and held by means of electrostatic chuck or the like. The position of the support stage 7 can be lifted up and down vertically by means of a lifting device 9 (placing means), so that the distance between plasma generated in the vacuum chamber 2 during film formation and the substrate 8 can be adjusted. In addition, an electrode portion 11 is provided to the support stage 7. To the electrode portion 11, the low-frequency power source 13 is connected via a matching box 12 (bias applying means). The low-frequency power source 13 can apply power to the electrode portion 11 at an oscillation frequency (for example, 4 MHz) lower than that of the high-frequency power source 6, so that a bias can be applied to the substrate 8. In addition, the support stage 7 is provided with a temperature controlling device (a substrate temperature controlling means; not illustrated) including a heater, a flow path for coolant, and the like, for controlling the temperature of the substrate 8. The temperature controlling device enables the temperature of the substrate 8 to be set to a desired temperature (for example, 150 to 700° C.).

Note that, when the substrate 8 is transferred to the top of the support stage 7, a gate door 17 provided to a sidewall of the vacuum chamber 2 is opened. After the substrate 8 is mounted on the support stage 7, the gate door 17 is closed. Then, a process to be described later is performed inside the vacuum chamber 2.

In addition, multiple gas nozzles 14 are provided to portions in sidewalls of the vacuum chamber 2 at positions which are lower than the ceiling plate 3 and higher than the support stage 7. A gas controller 15 can perform such control that gas is supplied through the gas nozzles 14 into the vacuum chamber 2 at a desired flow rate (gas supplying means). An alkylborazine compound and a carrier gas, which are to be described later, are used as the gas to be supplied. The alkylborazine compound to be described later is gasified, and then supplied to the vacuum chamber 2 with an inert gas used as the carrier gas. As the carrier gas, a rare gas (a noble gas) such as helium or argon, or nitrogen is generally used. Alternatively, a mixture gas thereof, or a mixture gas obtained by adding, as necessary, hydrogen, oxygen, ammonia, methane, or the like may be used. Note that the alkylborazine compound is preferably liquid under normal temperature and normal pressure. However, the alkylborazine compound may be solid as long as the alkylborazine compound can be gasified (sublimated) by heating or the like.

In addition, the vacuum chamber 2 is provided with a pressure controlling device (a vacuum pump, a pressure control valve, a vacuum gauge, and the like; not illustrated). The inside of the vacuum chamber 2 is evacuated on the bottom portion side of the vacuum chamber 2 by use of the vacuum pump, while the pressure inside the vacuum chamber 2 is adjusted to a desired pressure by use of the vacuum gauge and the pressure control valve.

The high-frequency power source 6, the lifting device 9, the low-frequency power source 13, the gas controller 15, the temperature controlling device, the pressure controlling device, and the like are controlled by a main controller 16 (controlling means), and are controlled in accordance with desired processing steps and processing conditions set in advance.

Next, a process for producing an insulating film for a semiconductor device of this embodiment implemented with the plasma CVD apparatus 1 is described specifically.

In the process for producing an insulating film for a semiconductor device of this embodiment, a compound shown in the following chemical formula 3 is used as the alkylborazine compound:

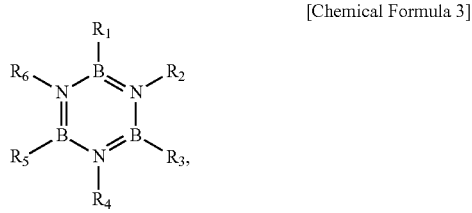

[Chemical Formula 3]

where side chain groups R1 to R6 in the above chemical formula 3 are each a hydrogen atom or an alkyl group having 5 carbon atoms or less, and may be the same or different, except in a case where all R1 to R6 are hydrogen atoms are excluded.

Especially, an alkylborazine compound in which at least one of R1, R3, and R5 is a hydrogen atom is preferable.

In this embodiment, the process for producing an insulating film for a semiconductor device is implemented with the above-described plasma CVD apparatus 1 in the following general procedure:

(1) With the carrier gas, a mixture gas containing a raw material gas obtained by gasifying the alkylborazine compound represented by the above-described chemical formula 3 is supplied into the vacuum chamber 2 through the gas nozzles 14.

(2) Electromagnetic waves are radiated into the vacuum chamber 2 from the high-frequency antenna 4, so that at least a part of the supplied mixture gas is ionized to form plasma. At this time, the plasma is formed as an inductively coupled-type plasma field having a high electron density by the plasma generation mechanism of the ICP-type.

(3) Each borazine skeletal molecule (borazine ring) and the side chain groups in the alkylborazine compound are dissociated from each other by this plasma, and then the borazine skeletal molecules undergo gas-phase polymerization, so that a borazine skeletal structure film is formed as the insulating film for a semiconductor device on a surface of the substrate 8 mounted on the support stage 7.

The film formation is desirably performed in such a way that the incorporation of the side chain groups, especially alkyl groups, dissociated from the alkylborazine compound into the thin film can be avoided during this film formation. This further increases the molecular weight of the borazine skeletal molecules which underwent the gas-phase polymerization, making it possible to obtain an insulating film having favorable characteristics. In order to achieve this, in this embodiment, the substrate 8 is placed at a position selected in an ingenious manner, more specifically, the distance from the ceiling plate 3 to the substrate 8 (the surface of the support stage 7) is increased by use of the lifting device 9. Thereby, with a distance being maintained between the substrate 8 and a plasma generating region having a high plasma density, the substrate 8 is placed in a plasma diffusion region where the electron density is decreased by diffusion in comparison with that in the plasma generating region.

Here, the placement of the substrate 8 in the plasma diffusion region is described in further detail by use of FIG. 2.

FIG. 2(a) shows a schematic structural view of a conventional plasma CVD apparatus having a plasma generation mechanism of a parallel flat plate type. As shown in FIG. 2(a), in the conventional plasma CVD apparatus, the plasma generation mechanism of the parallel flat plate type is structured by placing a lower electrode 22 serving as a support stage and also as an electrode and an upper electrode 23 in parallel with each other in a vacuum chamber 21. Then, a substrate 24 is mounted on the lower electrode 22, a predetermined raw material gas is supplied, and a high-frequency voltage is applied between the lower electrode 22 and the upper electrode 23. Thus, plasma is formed between the lower electrode 22 and the upper electrode 23.

In this plasma, as shown in the right part of FIG. 2(a), a substantially entire region located between the lower electrode 22 and the upper electrode 23 is occupied by a flat region having high electron densities, called a plasma generating region. In addition, a region called a sheath region where the electron density rapidly decreases is present in the extreme vicinity of each of the lower electrode 22 and the upper electrode 23 (for example, a region A shown in FIG. 2(a)). In this region A, the electrons are accelerated. In general, the sheath is generated in a region having a length of several millimeters located above the substrate 24. Even when the position of the lower electrode 22 (the substrate 24) is lifted up or down, the plasma generating region of the parallel flat plate type never changes.

As described above, the conventional plasma CVD apparatus having the plasma generation mechanism of the parallel flat plate type, the substrate 24 is located at a position close to a region having a high plasma electron density. For this reason, the borazine skeletal molecules and the alkyl groups in the alkylborazine compound dissociated from each other in the plasma are transported to the surface of the substrate 24 while being kept excited. Accordingly, when undergoing gas-phase polymerization, the borazine skeletal molecules are highly likely to be recombined with the excited alkyl groups. As a result, the alkyl groups are incorporated into the borazine skeletal structure film, and the amount of carbon in the thin film cannot be reduced. Thus, the leakage current cannot be reduced.

FIG. 2(b) shows a schematic structural view of the plasma CVD apparatus 1 according to the present invention shown in FIG. 1. As is also shown in FIG. 2(b), the plasma CVD apparatus 1 according to the present invention has a structure in which the high-frequency antenna 4 is placed above (immediately above) the ceiling plate 3. The high-frequency antenna 4 radiates electromagnetic waves into the vacuum chamber 2 to form plasma thereinside. Here, change in the electron density of the plasma (≈the plasma density) is shown in a direction away from the ceiling plate 3. As shown in the right part of FIG. 2(b), the plasma is formed to have the center of the electron density at a position slightly away from the ceiling plate 3. The electron density decreases gently and monotonically in a direction away from the center of the electron density and toward the substrate 8 on the support stage 7. Beyond the plasma generating region to the substrate, a plasma diffusion region is generated where the electron density is ⅔ or less of the maximum electron density in the plasma generating region, and electrons are not accelerated, but diffuse only due to concentration gradient.

In a case of a plasma generation mechanism of the ICP-type, plasma can be formed regardless of the position of the support stage (substrate). Accordingly, when the support stage 7 can be lifted up and down by the lifting device 9 as in the plasma CVD apparatus 1 according to the present invention, the substrate 8 is placed at a position with a low electron density (a plasma diffusion region B shown in FIG. 2(b)) by placing the support stage 7 (the substrate 8) at a position more distant from the ceiling plate 3.

The lifting device 9 should be controlled so that the substrate 8 can be placed in the plasma diffusion region B shown in FIG. 2(b). This secures a low-electron density region of several centimeters to several tens centimeters above the substrate 8.

As described above, with the plasma CVD apparatus 1 according to the present invention, the substrate 8 can be placed at a position away from a region (the plasma generating region) having a high plasma electron density. For this reason, the alkyl groups in the alkylborazine compound dissociated in the plasma can be converted into neutral molecules, before transported to the surface of the substrate 8. Such neutral molecules are hardly recombined with the borazine skeletal molecules, and exhausted as they are. As a result, when the borazine skeletal molecules undergo the gas-phase polymerization, the incorporation of the alkyl groups into the borazine skeletal structure film are suppressed, so that the amount of carbon in the thin film can be reduced. This makes it possible to reduce the leakage current.

As has been described above, in the plasma CVD apparatus 1 according to the present invention, the plasma generation mechanism of the ICP-type is used, and the substrate 8 is placed away from the ceiling plate 3 by use of the lifting device 9. Accordingly, during the formation of the borazine skeletal structure film by using the alkylborazine compound, the alkyl groups dissociated can be converted into neutral molecules, and the reaction efficiency of the gas-phase polymerization of the borazine skeletal molecules can be improved. As a result, the incorporation of the alkyl groups into the borazine skeletal structure film is suppressed, so that the amount of carbon in the thin film is reduced. This provides outstanding effects that the leakage current is reduced.

Note that, a plasma density generally obtained by a plasma generation mechanism of the parallel flat plate type is about $10^8$ to $10^9$ cm$^{-3}$, whereas a plasma density generally obtained by a plasma generation mechanism of the ICP type is $10^{10}$ to $10^{11}$ cm$^{-3}$, and is larger than that of the parallel flat plate type by one order of magnitude or more, although such plasma densities depend on processing conditions. Accordingly, when positional conditions for the placement of the substrates are the same therebetween, it is difficult to obtain the above-described effects by using only a plasma generation mechanism of the ICP type. In contrast, in the plasma CVD apparatus 1 according to the present invention, the plasma generation mechanism of the ICP type and the lifting device 9 are combined to secure a sufficient plasma diffusion region as well as a plasma generating region. Accordingly, the following advantages are achieved. Specifically, in the plasma generating region, the borazine skeletal molecules and the alkyl groups in the alkylborazine compound are efficiently dissociated from each other because of the high plasma density, whereas, in the plasma diffusion region, the dissociated alkyl groups are converted into neutral molecules, and the borazine skeletal molecules are subjected to an efficient gas-phase polymerization.

Characteristics of borazine skeletal structure films formed in this embodiment with the substrate 8 being placed in the plasma diffusion region are shown in Conditions 1 to 5 in Table 1 (Table 1 is shown after embodiments, and includes other Conditions together). In each of Conditions 1 to 5, a corresponding alkylborazine compound, which is shown in the row in Table 1 representing raw materials, was used, and a film was formed on a substrate under film formation conditions shown in Table 1. In addition, characteristics of the formed films were measured. Table 1 shows the results, as well. In Table 1, the time for the film formation process is set so that the thickness of the formed film can be 2000 Å to 3000 Å. The results in Conditions 1 to 5 in Table 1 show that, in each case, the film had characteristics such as a low carbon content, a low permittivity, a low leakage current, and a high mechanical strength, and exhibited long-term stability in terms of the characteristics.

In addition, a comparative example to Condition 3 in Table 1 is shown in Comparative Example 1 in Table 1. The substrate position was closer to the ceiling plate 3 in Comparative Example 1 than in Condition 3 shown in Table 1. Specifically, the substrate position in Comparative Example 1 was a position in the plasma generating region. In Comparative Example 1, a film was formed on a substrate under film formation conditions which were the same as those in Condition 3 shown in Table 1, and characteristics of the formed film were measured. Table 1 shows the results, as well. The results of Comparative Example 1 shown in Table 1 indicate that the C content in the borazine skeletal structure film was high, and the leakage current was so large that the leakage current exceeded 5E-8 A/cm$^2$, which is a leakage current applicable in an insulating film. Note that the C content was obtained by analyzing the element contents in the thin film by X-ray photoelectron spectroscopy (XPS), and then determining the ratio (%) of the content of carbon (C) relative to the sum of element contents of carbon (C), boron (B), and nitrogen (N), i.e., C/(C+B+N).

Figure 3A:
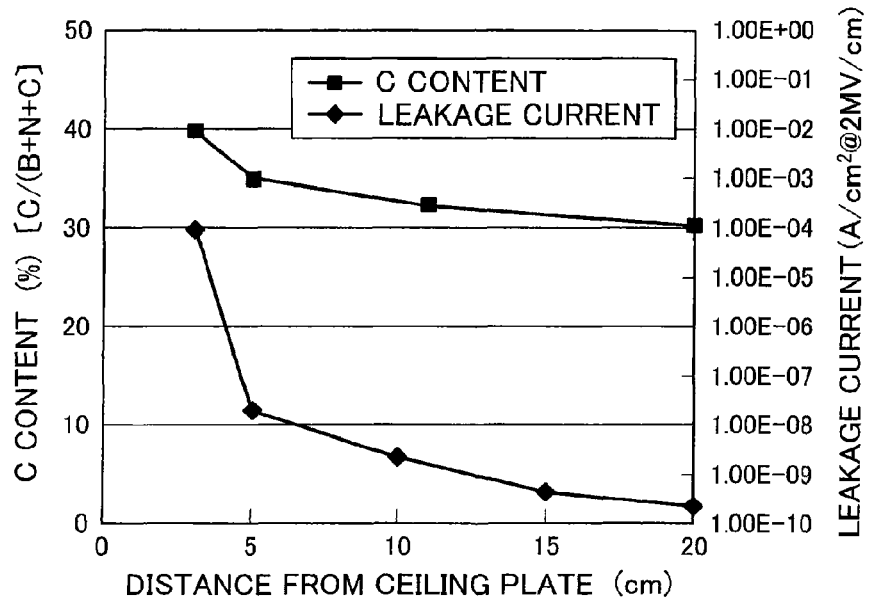
FIG. 3 shows results obtained when characteristics of insulating films for a semiconductor device formed by a production process according to the present invention with the distance from a ceiling plate being varied were measured, where (a) shows a graph of measurements of carbon content and leakage current, and (b) is a graph of measurements of change in leakage current and relative permittivity with the elapse of time.

With Condition 3 in Table 1 being taken as a reference, measurements were conducted by changing the distance from the ceiling plate 3. The results shown in FIG. 3(a) were obtained. As shown in FIG. 3(a), it can be seen that as the distance from the ceiling plate increases, the C content in a borazine skeletal structure film decreases. Moreover, the leakage current decreased in proportion to the C content.

Figure 3B:
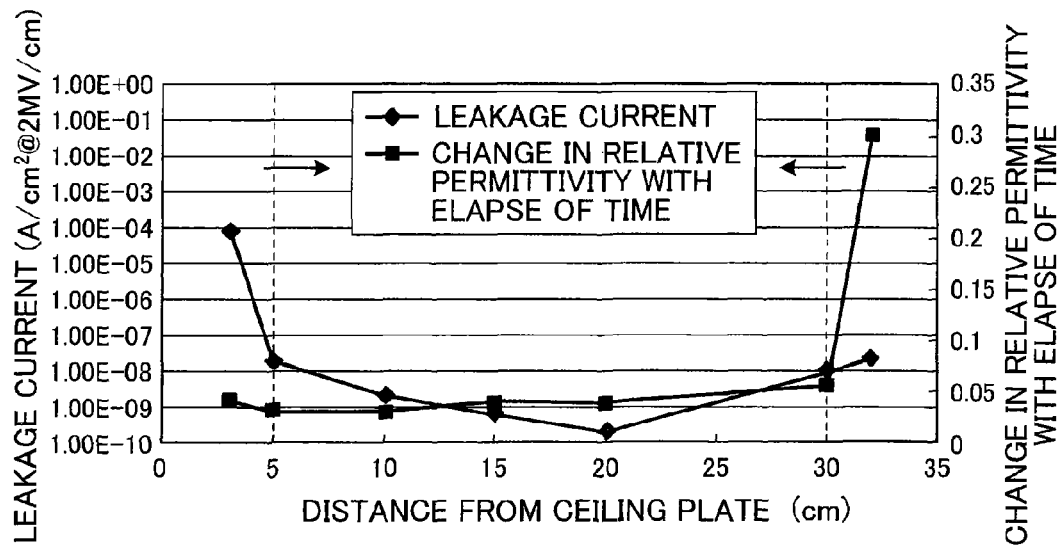

In addition, to determine an appropriate range of the distance from the ceiling plate 3, changes in leakage current and relative permittivity with the elapse of time were measured by changing the distance from the ceiling plate 3 with Condition 3 in Table 1 being taken as a reference. The results shown in FIG. 3(b) were obtained. As shown in FIG. 3(b), the lower limit of the distance from the ceiling plate 3 is 5 cm. If the substrate is closer to the ceiling plate 3 than this position, the dissociated alkyl groups are incorporated into the film as they are, and the C content in the film is increased, so that the leakage current becomes large, as shown also in FIG. 3(*a*).

Meanwhile, the upper limit of the distance from the ceiling plate 3 is 30 cm. If the substrate is more distant from the ceiling plate 3 than this position, reactive species of the borazine skeletal molecules are deactivated, and the gas-phase polymerization does not progress. Accordingly, the obtained borazine skeletal structure film becomes so incomplete that the degradation thereof with the elapse of time is likely to occur. This leads to a significant change in relative permittivity with the elapse of time. The change in relative permittivity with the elapse of time is a difference between relative permittivity after the formation of the thin film and relative permittivity 2 weeks after the formation. This indicates that the distance from the ceiling plate 3 is desirably in a range from 5 cm to 30 cm, both inclusive. Note that if the distance from the ceiling plate 3 increases, the rate of the film formation decreases. This may makes it impossible to form a film in a practically acceptable time. Hence, the distance from the ceiling plate 3 is desirably 20 cm or less.

In addition, considering the position at which the substrate 8 is placed from the view point of the electron temperature, the film formation is desirably performed with the substrate 8 being placed at a position where the electron temperature is 3.5 eV or less. This electron temperature is an electron temperature for preventing second dissociation of neutral molecules formed by the recombination of the alkyl groups dissociated from the alkylborazine compound. The threshold of the electron temperature is determined on the basis of the lowest dissociation energy required for dissociation of these neutral molecules, namely 3.5 eV.

Second Embodiment

A process for producing an insulating film for a semiconductor device of this embodiment is performed on the basis of the production apparatus and the production process described in the first embodiment. Accordingly, in the following, this embodiment is described while description overlapping with that in the first embodiment is omitted.

In the process for producing an insulating film for a semiconductor device of this embodiment, at least one selected from the group consisting of ammonia and amine compounds each having an alkyl group having 1 to 3 carbon atoms is supplied into the vacuum chamber 2 through the gas nozzles 14, in addition to the mixture gas described in the first embodiment (the carrier gas+the raw material gas obtained by gasifying the alkylborazine compound represented by chemical formula 3). Note that the supply method is not shown in the drawings, but the gases may be supplied by using respective nozzles. Then, electromagnetic waves are radiated into the vacuum chamber 2 from the high-frequency antenna 4 to form plasma. The borazine skeletal molecules and the side chain groups in the alkylborazine compound are dissociated by the formed plasma. Then, the borazine skeletal molecules are allowed to undergo gas-phase polymerization. Thus a borazine skeletal structure film is formed on a surface of the substrate 8 (see FIG. 1). Note that amine compounds each having 4 or more carbon atoms have an extremely low vapor pressure, and hence do not gasify at 10 to 50 mTorr, which is pressure employed in the present invention. Accordingly, such amine compounds are not suitable for being applied to the film formation.

In the film formation, the film formation is desirable performed in such a way that the incorporation of the alkyl groups dissociated form the alkylborazine compound into the thin film can be avoided, as in the case of the first embodiment. In this respect, in this embodiment, the position of the substrate 8 is set away from the ceiling plate 3 as in the case of the first embodiment. In addition, at least one selected from the group consisting of ammonia and amine compounds each having an alkyl group having 1 to 3 carbon atoms is supplied with the alkylborazine compound. This makes it possible to convert the alkyl groups into neutral molecules more efficiently in this embodiment than in the first embodiment. For example, there is $C_2H_5NH_2$, namely ethylamine, as an amine compound having 2 carbon atoms. Before being the transported to the surface of the substrate 8, the dissociated alkyl groups can be allowed to react with a product of dissociation of $C_2H_5NH_2$, to thereby being converted into alkyl amines which are neutral molecules. The alkyl amines are less likely to be recombined with the borazine skeletal molecules, and are eventually exhausted as it is. Accordingly, in comparison with the first embodiment, the incorporation of the alkyl groups into the borazine skeletal structure film is more suppressed so that the amount of the carbon in the thin film can be more reduced, and the leakage current can be more reduced in the gas-phase polymerization of the borazine skeletal molecules.

Figure 8:
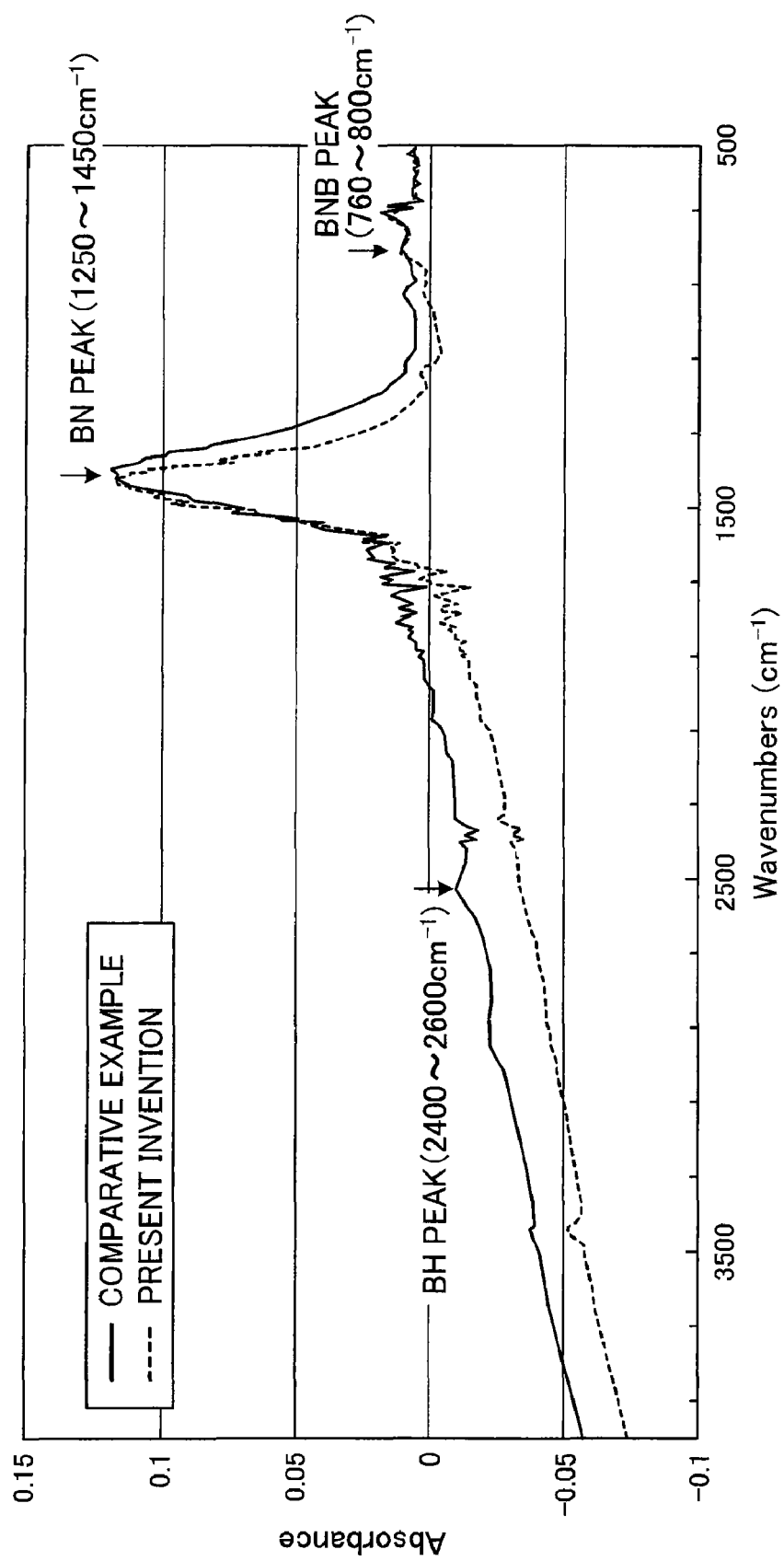
FIG. 8 is a graph showing characteristics of an insulating film for a semiconductor device formed by the production process according to the present invention, where the characteristics were evaluated by infrared absorption measurement.

Moreover, as will be also described with reference to FIG. 8 to be described later, by supplying at least one selected from the group consisting of ammonia and amine compounds each having an alkyl group having 1 to 3 carbon atoms, not only the incorporation of the alkyl groups into the thin film is suppressed, but also a structure (B—N—B bond) in which N (nitrogen) dissociated from ammonia, the amine compound having an alkyl group having 1 to 3 carbon atoms, or the like is introduced as a spacer is formed during the cross-linking between borazine skeletal structures. As a result, the borazine skeletal structures are less likely to condense with each other. Presumably, this also contributes to the reduction in leakage current.

Figure 4:
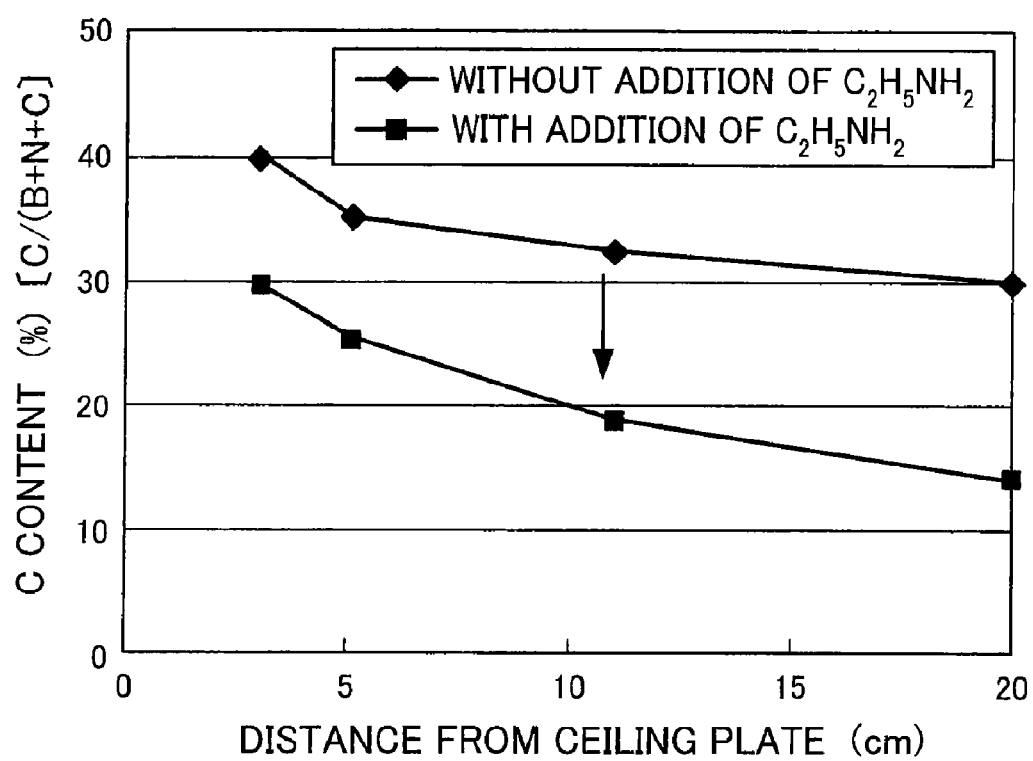
FIG. 4 is a graph of carbon content which is a characteristic of insulating films for a semiconductor device formed by the production process according to the present invention in the presence or absence of $C_2H_5NH_2$ with the distance from a ceiling plate being varied.

Characteristics of borazine skeletal structure films actually formed in this embodiment are shown in Conditions 6 to 8 in Table 1. In each of Conditions 6 to 8, a corresponding amine compound, which is shown in the row in Table 1 representing the raw materials, was used, and a film was formed on a substrate under film formation conditions shown in Table 1. In addition, characteristics of the formed films were measured. Table 1 shows the results, as well. With Condition 8 in Table 1 being taken as a reference, measurements were conducted by changing the distance from the ceiling plate 3, and the results shown in FIG. 4 were obtained. In FIG. 4, the graph for the case where no $C_2H_5NH_2$ was added shows the results of measurement conducted by changing the distance from the ceiling plate 3 with the Condition 3 in Table 1 being taken as a reference, and is shown for the sake of comparison (see FIG. 3(*a*)). As shown the graph of FIG. 4 for the case where $C_2H_5NH_2$ was added, the tendency that the C content in the borazine skeletal structure film decreased as the distance from the ceiling plate increased is the same as that in the first embodiment. However, it can be understood that the C content in the borazine skeletal structure film was more reduced in this embodiment than in the first embodiment (the graph for the case where no $C_2H_5NH_2$ was added). Note that the C content was determined as C/(C+B+N) by analyzing element contents in each thin film by XPS as in the case of FIG. 3(*a*).

In addition, it can be seen from FIG. 4 that, when the C content is the same, the distance from the ceiling plate 3 can be made smaller in this embodiment than in the first embodiment. When the distance from the ceiling plate 3 is too large, the film formation rate may lower (the throughput may deteriorate). However, a desired C content, i.e., a desired low leakage current can be achieved by adding $C_2H_5NH_2$ or the like as in the case of this embodiment even when the distance from the ceiling plate 3 is not increased. In addition, since the film formation rate does not lower, the throughput can be improved. It should be noted, however, that when the amount of ammonia, the amine compound having an alkyl group having 1 to 3 carbon atoms, or the like is large relative to the flow rate of the alkylborazine compound, the film formation rate lowers. Hence, the ratio of ammonia or the amine compound added (molar ratio between the flow rate of ammonia or the amine compound/the flow rate of the alkylborazine compound) is preferably 30-fold or less.

Note that specific examples of the amine compound having an alkyl group having 1 to 3 carbon atoms include monoalkylamines, dialkylamines, and trialkylamines such as methylamine, ethylamine, dimethylamine, n-propylamine, isopropylamine, trimethylamine, diethylamine, di-n-propylamine, and tri-n-propylamine.

Third Embodiment

A process for producing an insulating film for a semiconductor device of this embodiment is also performed on the basis of the production apparatus and the production process described in the first embodiment. Accordingly, in the following, this embodiment is described while description overlapping with that in the first embodiment is omitted.

The mechanical strength of a borazine skeletal structure film generally needs to be 10 GPa or more in terms of Young's modulus. In this respect, this requirement was met as shown in the graph in FIG. 5(b) to be described below even when no LF power (bias) was applied during the formation of the borazine skeletal structure film (see the Young's modulus at a LF power=0 in the graph in the FIG. 5(b)). However, to further increase the mechanical strength of the borazine skeletal structure film, a LF power is desirably applied to the substrate 8 during film formation by using the low-frequency power source 13. The application of a LF power promotes the gas-phase polymerization of the borazine skeletal molecules. Hence, there are advantages not only that the mechanical strength thereof is increased, but also that the water resistance, the heat resistance, and the chemical resistance are improved.

Figure 5A:
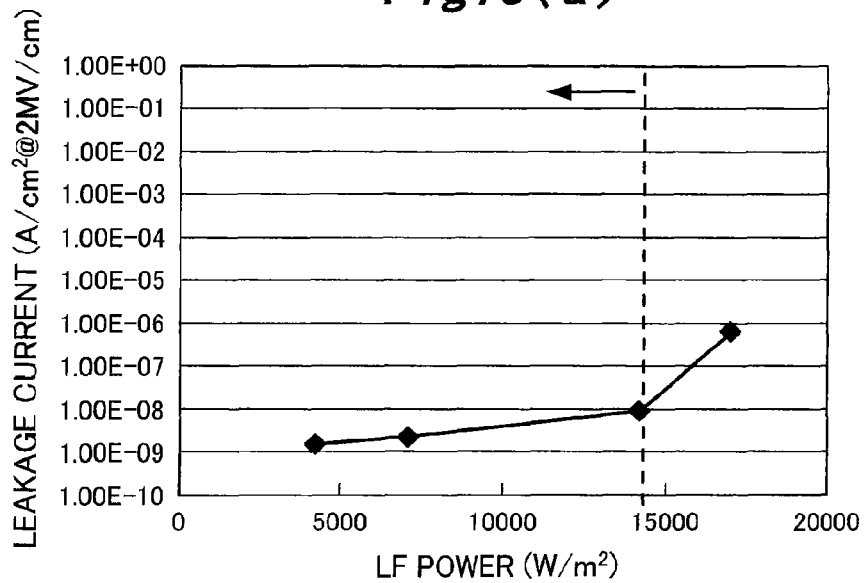
FIG. 5 shows results obtained when characteristics of insulating films for a semiconductor device formed by the production process according to the present invention with the LF power being varied were measured, where (a) is a graph showing measurements of leakage current, and (b) is a graph showing measurements of Young's modulus and leakage current in cases where $C_2H_5NH_2$ was added and in cases where no $C_2H_5NH_2$ was added.
Figure 5B:
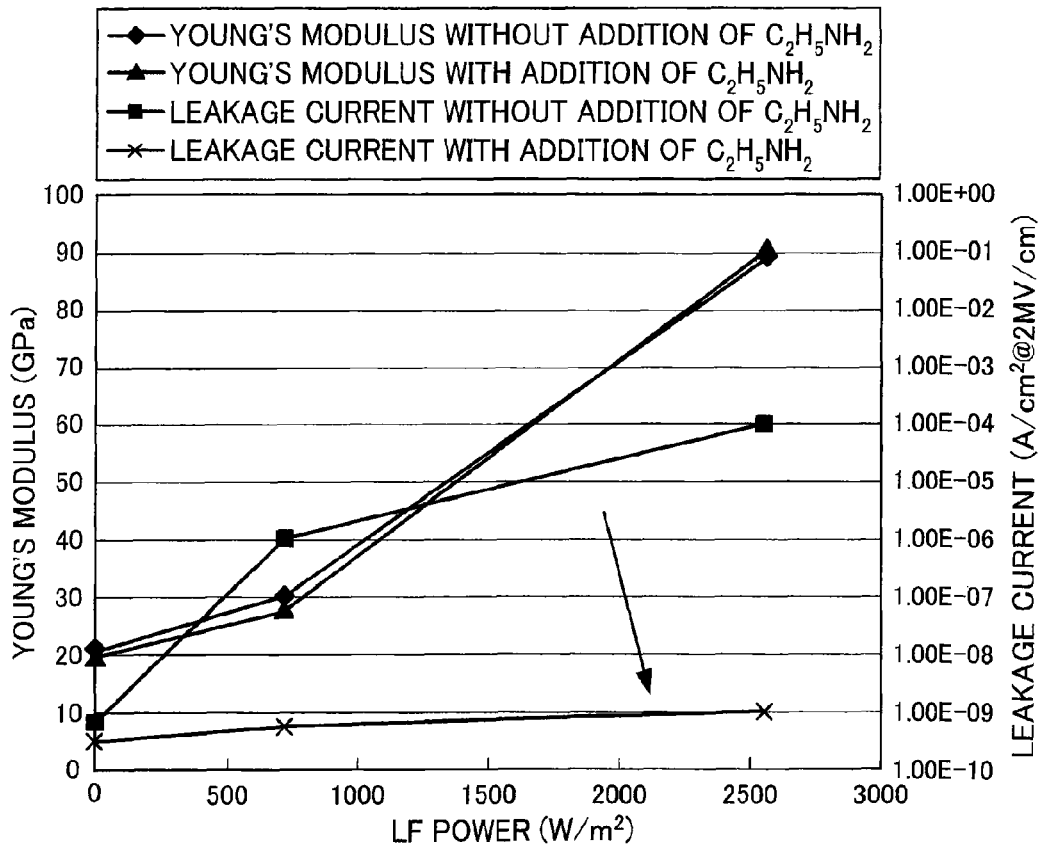

This embodiment is a combination with the second embodiment. Here, characteristics of borazine skeletal structure films were measured while the LF power was changed in the presence or the absence of $C_2H_5NH_2$. Specifically, with Condition 3 in Table 1 where no $C_2H_5NH_2$ was added and Condition 8 where $C_2H_5NH_2$ was added being taken as references, measurements were conducted by increasing the LF power. The results shown in FIG. 5(b) were obtained. As shown in FIG. 5(b), regardless of the presence or the absence of $C_2H_5NH_2$, the Young's modulus increases, as the LF power increases. On the other hand, the leakage current increases by $10^5$-fold or more with the increase of the LF power, when no $C_2H_5NH_2$ was added. However, in a case where the $C_2H_5NH_2$ is added, even when the LF power was increased, the leakage current was increased by 10 fold or less. Accordingly, a leakage current value applicable in an insulating film, i.e., 5E-8A/$cm^2$ or less can be maintained. This indicates that when $C_2H_5NH_2$ is added, a larger LF power can be applied, and the mechanical strength, the water resistance, the heat resistance, and the chemical resistance can be further improved while the leakage current being suppressed low.

In addition, characteristics of borazine skeletal structure films are shown in Condition 9 and 10 in Table 1. In each of Conditions 9 and 10, a film was formed on a substrate under film formation conditions shown in Table 1, and characteristics of the formed film were measured. Table 1 shows the results, as well. In addition, when the LF power was changed with Condition 9 in Table 1 being taken as a reference, results shown in FIG. 5(a) were obtained. The correlation between the LF power and the leakage current was found to be as follows. Specifically, as shown in FIG. 5(a), the leakage current tended to increase as the LF power increased. When the LF power exceeded 14500 W/$m^2$, the leakage current exceeded 5E-8A/$cm^2$, which is a leakage current applicable in an insulating film. In the formation of the borazine skeletal structure film, it is important that the side chain groups of the borazine skeletal molecules be dissociated without breaking the borazine skeletal structure, and the gas-phase polymerization of the borazine skeletal molecules be caused. However, when the LF power is too high, the borazine skeletal structure is more likely to be broken. It is presumable that, as a result of this, conversion of the borazine skeletal molecules, which had undergone the gas-phase polymerization, into graphite proceeded (uncombined molecules were increased), adversely affecting the characteristics of the leakage current. Accordingly, from the view point of the leakage current, the upper limit of the LF power during the formation of the borazine skeletal structure film is desirably 14500 W/$m^2$ or less per unit area of the substrate 8.

Fourth Embodiment

A process for producing an insulating film for a semiconductor device of this embodiment is also performed on the basis of the production apparatus and the production process described in the first embodiment. Accordingly, in the following, this embodiment is described while description overlapping with that in the first embodiment is omitted.

In the formation of the borazine skeletal structure film, control of the temperature of the substrate 8 to an appropriate value is also desirable, in addition to the application of an appropriate LF power to the substrate 8.

Figure 6:
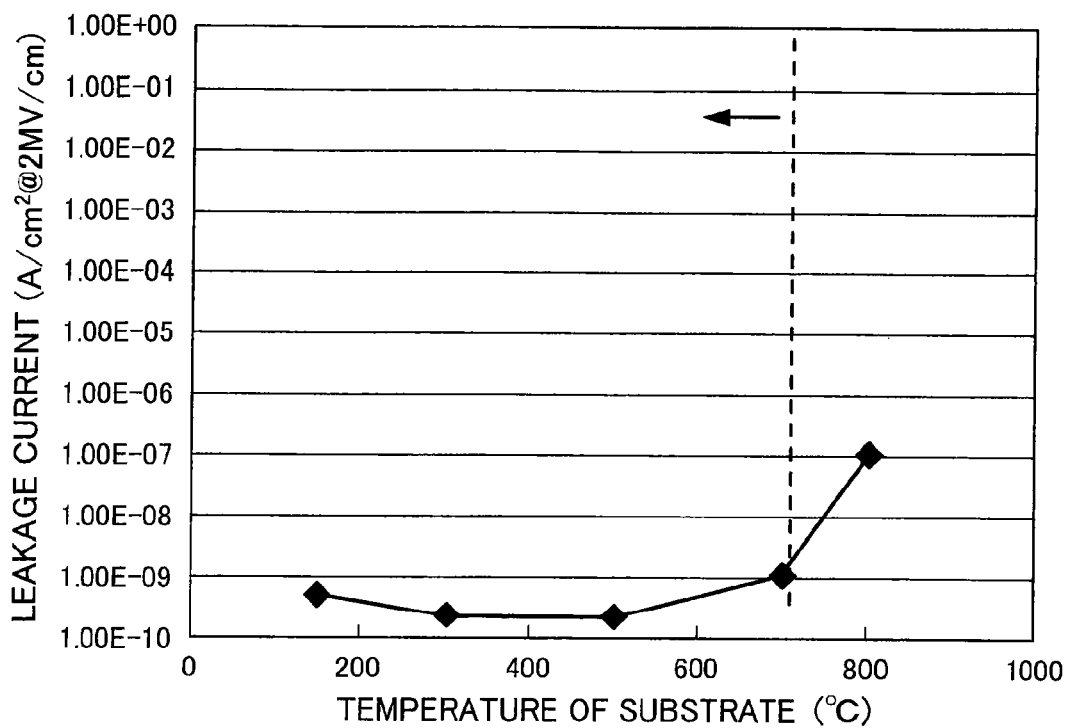
FIG. 6 is a graph showing results obtained when leakage current was measured as a characteristic of insulating films for a semiconductor device formed by the production process according to the present invention with substrate temperature being varied.

In this respect, the correlation between the temperature of the substrate and the leakage current was checked by changing the temperature of the substrate, with the Condition 10 in table 1 being taken as a reference. As shown in FIG. 6, until the temperature exceeded 700° C., the leakage current exhibited no major change, and took values smaller than 5E-8 A/$cm^2$. However, when the temperature exceeded 700° C., the leakage current exceeded 5E-8A/$cm^2$, which is a leakage current value applicable in an insulating film. This was presumably because when the temperature of the substrate exceeded 700° C., a part of the borazine skeletal molecules started to condense with each other, and this adversely affected the characteristics of the leakage current. Here, the state between the borazine skeletal molecules in the formed borazine skeletal structure film is desirably in a single bond state. Accordingly, the upper limit of the substrate temperature during the formation of the borazine skeletal structure film is desirably 700° C. or lower, from the view point of the leakage current. Meanwhile, the lower limit thereof is desirably not lower than 150° C., which is a gasification temperature of the raw material gas, specifically, the alkylborazine compound, so as to avoid the gasification of the raw material gas in the vacuum chamber 2. This is because when the substrate temperature is lower than 150° C., the alkylborazine compound may liquefy on a surface of the substrate, and accordingly the polymerization may proceed insufficiently, which results in the formation of a thin film susceptible to degradation with the elapse of time. Note that in a case where underlying metal wiring of Al (aluminum) or the like is present, or similar cases, the upper limit temperature may be further low, i.e., 400° C., in consideration of effects (damage) of temperature on the metal wiring or the like.

As described above, the gas-phase polymerization of the borazine skeletal molecules is promoted by controlling the temperature of the substrate 8 to an appropriate value, so that the leakage current, the mechanical strength, the water resistance, the heat resistance, and the chemical resistance can further be improved. In addition, an effect that the concentration of impurities in the thin film is reduced can also be achieved. In addition, this embodiment can provide better improving effects when being combined not only with the first embodiment, but also with the second and third embodiments. Note that the same temperature condition of the substrate may be employed in a reaction promoting step to be described later (see a sixth embodiment).

Fifth Embodiment

A process for producing an insulating film for a semiconductor device of this embodiment is also performed on the basis of the production apparatus and the production process described in the first embodiment. Accordingly, in the following, this embodiment is described while description overlapping with that in the first embodiment is omitted.

In the formation of the borazine skeletal structure film, appropriate application of the RF power is desirable, in addition to the application of an appropriate LF power to the substrate 8 and the control of the temperature of the substrate 8 to an appropriate value.

Figure 7:
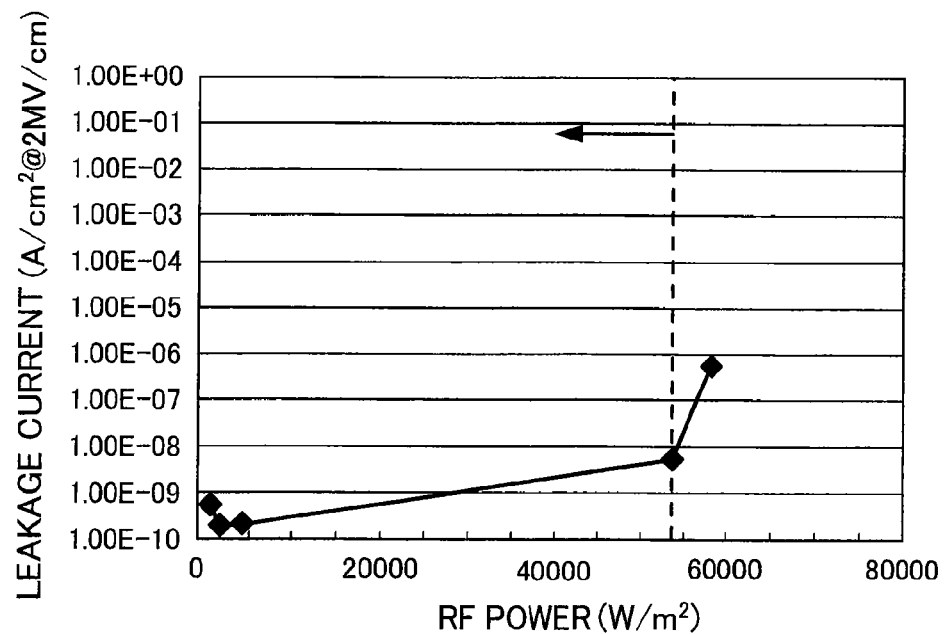
FIG. 7 is a graph showing results obtained when leakage current was measured as a characteristic of insulating films for a semiconductor device formed by the process for producing according to the present invention with RF power being varied.

In this respect, the correlation between the RF power and the leakage current was checked by changing the RF power, with Condition 10 in Table 1 being taken as a reference. As shown in FIG. 7, the leakage current tended to gradually increase, as the RF power increased. When the RF power exceeded 53000 W/m$^2$, the leakage current increased steeply, and exceeded 5E-8A/cm$^2$. In formation of the borazine skeletal structure film, it is important that the side chain groups of the borazine skeletal molecules be dissociated without breaking the borazine skeletal structure, and that the gas-phase polymerization of the borazine skeletal molecules be caused. However, when the RF power is too high, the borazine skeletal structure is more likely to be broken. It is presumable that, as a result of this, conversion of the borazine skeletal molecules, which had been undergone the gas-phase polymerization, into graphite proceeded (uncombined molecules were increased), adversely affecting the characteristics of the leakage current. Accordingly, from the view point of the leakage current, the upper limit of the RF power for formation of the borazine skeletal structure film is desirably 53000 W/m$^2$ or less per unit area. Meanwhile, the lower limit of the RF power is desirably 800 W/m$^2$ or more per unit area, in consideration of stability of ignition of the plasma.

By applying the RF at an appropriate power as described above, the gas-phase polymerization of the borazine skeletal molecules is promoted. This makes it possible to further improve the leakage current, the mechanical strength, the water resistance, the heat resistance, and the chemical resistance.

In addition, this embodiment can provide better improving effects when being combined not only with the first embodiment, but also with the second, third, and fourth embodiments.

Sixth Embodiment

In the above-described first to fifth embodiments, the film formation process for forming the borazine skeletal structure film itself has been described. In particular, characteristics of the thin film in terms of change with the elapse of time can be greatly improved by subjecting a formed thin film to a post-treatment (hereinafter referred to as a reaction promoting step) after the film formation process using the production process of any one of the above-described first to fifth embodiments, i.e., by constituting a processing step including two-stages of the film formation step and the reaction promoting step.

As described above, in the film formation process using the production process of any one of the first to fifth embodiments, the side chain groups of the alkylborazine compound are dissociated without breaking the borazine skeletal structure of the alkylborazine compound, and the gas-phase polymerization of the borazine skeletal molecules is caused while the incorporation of the dissociated side chain groups is avoided. With this film formation process, a thin film having the borazine skeletal structure is formed, and the basic characteristics of the borazine skeletal structure film, specifically, the characteristics such as the lowered permittivity, a low leakage current, a high mechanical strength are established. Then, after completion of this film formation process, the process transitions to the reaction promoting step.

The reaction promoting step in this embodiment is a plasma treatment process for promoting cross-linking reaction of the borazine skeletal molecules in the thin film formed on the substrate 8. Accordingly, no film formation is necessary. Hence, the formed thin film is subjected to a plasma treatment by using plasma mainly made from a gas not containing the raw material gas, for example, a carrier gas. To eliminate the possibility of the reaction of the carrier gas with the thin film, a gas such as a rare gas (He, Ar, or the like), $N_2$, or the like is particularly desirable as the carrier gas used in the reaction promoting step at this time. Note that, as the means for promoting the cross-linking reaction of the borazine skeletal molecules, a heat treatment, an ultraviolet irradiation treatment, an electron beam irradiation treatment, an ion irradiation treatment, or the like is also effective, besides the plasma treatment.

Also in this reaction promoting step, there are appropriate conditions of a LF power and an RF power as in the case of the film formation process. For example, to promote the cross-linking reaction of the borazine skeletal molecules, the LF power in the reaction promoting step is made greater than the LF power in the film formation process. However, if the LF power in the reaction promoting step is too large, the thin film is damaged because of the sputtering effect. Accordingly, the LF power is desirably 127400 W/m$^2$ or less. Moreover, to prevent the degradation of the thin film with the elapse of time, the application time of the LF power is also important. Here, [LF power×time] is desirably 254500 W/m$^2$·s or more. If the [LF power×time] is less than 254500 W/m$^2$·s, the effect of improving the state of the degradation with the elapse of time cannot be obtained sufficiently.

Meanwhile, if the RF power in the reaction promoting step is too large, the mechanical strength tends to be greatly lowered. Accordingly, the RF power in the reaction promoting step is desirably 53000 W/m$^2$ or less. In addition, the lower limit of the RF power is desirably 800 W/m$^2$ or more, in consideration of the stable ignition of plasma. As described above, the RF power in the reaction promoting step is desirably 800 W/m$^2$ to 53000 W/m$^2$, both inclusive. These are the same conditions as those in the film formation process.

In this reaction promoting step, by causing condensation of reactive groups remaining in the borazine skeletal structure film formed in the film formation process, the cross-linking reaction is promoted, and also the B—H bonds are removed. Accordingly, the permittivity is further lowered by promoting the cross-linking reaction, and the change with the elapse of time is suppressed by removing the B—H bonds, which may serve as active sites in a reaction with water. These lead to the improvement in stability. In addition, the promotion of the cross-linking reaction further increases the mechanical strength (mechanical strength Young's modulus 10 GPa or more). This leads to improvement in chemical resistance, improvement in processability, and improvement in CMP (chemical mechanical polishing) resistance. In addition, since an inorganic polymer-based material having a better heat resistance than organic polymer materials is used, a higher heat resistance is also achieved.

Characteristics of the borazine skeletal structure films formed in this embodiment are shown in Conditions 11 to 15 in Table 1. In each of Conditions 11 to 15, a film was formed on a substrate under film formation conditions shown in Table 1, and was subjected to the reaction promoting step shown in the row in Table 1 representing the reaction promoting step. Then, characteristics of the formed film were measured. Table 1 shows the results, as well. The effect on the degradation with the elapse of time achieved by performing the reaction promoting step is prominent. Specifically, after 14 days had elapsed, the relative permittivity in each of Conditions 1 to 10 where the reaction promoting step was absent satisfied a requirement of 0.1 or less, which is a characteristic required for a film. However, the relative permittivity changed by 0.03 or more in comparison with the initial value thereof. In contrast, in each of Conditions 11 to 15 where the reaction promoting step was present, the change in relative permittivity is 0.01 or less even after 14 days had elapsed. This shows that the change with the elapse of time can be more suppressed in a case where the reaction promoting step is present than in a case where the reaction promoting step is absent. Note that the stability of the relative permittivity was checked through evaluation performed by leaving the film in an environment at a temperature of 25° C. and a humidity of 50% Rh.

Incidentally, when all the above-described first to sixth embodiments are combined, the production process according to the present invention is performed in the plasma CVD apparatus 1 shown in FIG. 1, in the following procedure, for example.

(Step 1)

By use of a transferring device not illustrated, a substrate 8 is transferred through the gate door 17 into the vacuum chamber 2, and mounted on the support stage 7. Then the substrate 8 is attached and held by means of electrostatic chuck. The temperature of the support stage 7 is controlled to a temperature in the range from 150° C. to 700° C. by the temperature controlling device. By controlling the temperature of the support stage 7, the temperature of the substrate 8 is controlled so that the substrate 8 can be processed at a desired setting temperature. In addition, the height position of the support stage 7 (the substrate 8) is moved by the lifting device 9 to a position in the range of 5 cm to 30 cm away from the ceiling plate 3.

(Step 2)

By using the gas controlling means 15, a carrier gas (for example, He gas) is supplied through the gas nozzles 14 into the vacuum chamber 2. The degree of vacuum in the vacuum chamber 2 is controlled to about 10 to 50 mTorr by the vacuum controlling device. A RF power with a frequency of 13.56 MHz is supplied to the high-frequency antenna 4 from the high-frequency power source 6 thorough the matching box 5. Thus, electromagnetic waves are radiated into the vacuum chamber 2, so that plasma is generated in the vacuum chamber 2. The RF power supplied by the high-frequency power source 6 is controlled at a power in the range from 800 $W/m^2$ to 53000 $W/m^2$ until the series of processes are completed. Note that the flow rate of the carrier gas supplied through the gas nozzles 14 is controlled at an appropriate flow rate until the series of processes are completed, and is preferably about 200 sccm to 1000 sccm.

(Step 3)

After the plasma is stabilized, a LF power with a frequency of 4 MHz is supplied to the electrode 11 from the low-frequency power source 13 through the matching box 12. The gasified alkylborazine compound shown in chemical formula 3 is supplied into the vacuum chamber 2 through the gas nozzles 14 while the amount of the alkylborazine compound is gradually increased until a predetermined amount is reached. The degree of vacuum in the vacuum chamber 2 is controlled at about 10 to 50 mTorr. At this time, ammonia, the amine compound having an alkyl group having 1 to 3 carbon atoms (for example, $C_2H_5NH_2$), or the like is also supplied at about 200 sccm, along with the alkylborazine compound. In the film formation process, the LF power supplied by the low-frequency power source 13 is controlled at a power in the range from 0 $W/m^2$ to 14500 $W/m^2$. Then, under the above-described processing conditions, the film formation reaction in the film formation process, i.e., the gas-phase polymerization of the borazine skeletal molecules in the plasma state occurs, and then the product is adsorbed onto the substrate 8. Thus, a film formation reaction in which a desired borazine skeletal structure film is formed is performed.

(Step 4)

When the film formation process is performed for a predetermined period of time, and a thin film having a desired film thickness is formed on the substrate 8, the film formation process is completed. Subsequently, the reaction promoting step is performed. Specifically, the LF power supplied from the low-frequency power source 13 to the electrode 11 is set at a magnitude different from the LF power in the film formation process, and the alkylborazine compound, and ammonia, the amine compound having an alkyl group having 1 to 3 carbon atoms, or the like, which are being supplied into the vacuum chamber 2 through the gas nozzles 14, are supplied, while the amounts thereof are gradually decreased, so that the degree of vacuum in the vacuum chamber 2 is controlled to about 10 to 50 mTorr. In this reaction promoting step, the [LF power×application time] of the low-frequency power source 13 is 254500 $W/m^2 \cdot s$ or more, and the LF power is controlled to a power of 127400 $W/m^2$ or less. Accordingly, under the above-described processing conditions, the reaction in the reaction promoting step is promoted, i.e., the cross-linking reaction of the borazine skeletal molecules is promoted.

By carrying out the above-described procedure, it is possible to obtain a borazine skeletal structure film having characteristics of a low permittivity, a low leakage current, and a high mechanical strength, and moreover to obtain a borazine skeletal structure film whose characteristics of the low permittivity, the low leakage current, and the high mechanical strength undergo less change with the elapse of time. Regarding the specific characteristics thereof, a lowered permittivity (relative permittivity: 3.5 or less), a lowered leakage current (leakage current: 5E-8A/cm$^2$ or less), a high mechanical strength (Young's modulus: 10 GPa or more) can be achieved. In addition, regarding the stability of the characteristics, a stability of the relative permittivity (change in relative permittivity with the elapse of time: 0.1 or less) can be achieved.
<Proprieties of Insulating Film for Semiconductor Device according to Present Invention>

The insulating film for a semiconductor device (the borazine skeletal structure film) according to the present invention formed by using the process for producing of any one of the above-described first to sixth embodiments has characteristics of a lowered permittivity (relative permittivity: 3.5 or less), a lowered leakage current (leakage current: 5E-8 A/cm$^2$ or less), and further has the following characteristics.

(1) Infrared Absorption Measurement

The infrared absorption measurement is a measurement for information on functional groups, qualitative analysis of compounds, and the like. It is possible from the measurement results thereof to determine characteristics (for example, hygroscopic property, long-term stability, and the like) of an object. For the measurement, NEXUS 670 manufactured by Thermo Nicolet Corporation was used. The borazine skeletal structure film obtained in Comparative Example and the borazine skeletal structure films produced in accordance with the present invention were evaluated by the infrared absorption measurement. As a result, as shown in FIG. 8, a large absorption peak corresponding to B—N bonds was observed in a wave number region of 1250 to 1450 cm$^{-1}$, an absorption peak corresponding to B—H bonds was observed in a wave number region of 2400 to 2600 cm$^{-1}$, and an absorption peak corresponding to B—N—B bonds was observed in a wave number region of 760 to 800 cm$^{-1}$.

Moreover, as shown in Conditions 1 to 15 in Table 1, the ratio [B1/A] in each of the borazine skeletal structure films formed in accordance with the present invention is 0.05 or less, where A represents an absorption intensity in the wave number region of 1250 to 1450 cm$^{-1}$, which corresponds to the B—N bonds, and B1 represents an absorption intensity in the wave number region of 2400 to 2600 cm$^{-1}$, which corresponds to the B—H bonds. The results indicate that the film obtained in accordance with the present invention has a small number of B—H bonds, and a high long-term stability.

In addition, as shown in Conditions 1 to 15 in Table 1, the ratio [B2/A] in each of the borazine skeletal structure film formed in accordance with the present invention is 0.10 or more, where B2 represents an absorption intensity in the wave number region of 760 to 800 cm$^{-1}$, which corresponds to the B—N—B bonds. A B—N—B bond represents a structure in which N (nitrogen) dissociated from the alkylborazine, the alkyl amine, or the like is interposed between borazine skeletal structures which are cross-linked with each other. Formation of such a structure increases the long-term stability. These results indicate that a film formed in accordance with the present invention has a large number of B—N—B bonds, and a high long-term stability. More preferably, the ratio [B1/A] is 0.05 or less, and the ratio [B2/A] is 0.10 or more. In such a case, the long-term stability is further improved.

(2) XPS Measurement

The XPS measurement can determine binding energies of elements, and the like. It is possible form the measurement results to determine characteristics (for example, composition ratio, and the like) of an object. For the measurement, Quantum 2000 manufactured by ULVAC-PHI was used. The borazine skeletal structure film obtained in Comparative Example and the borazine skeletal structure films formed in accordance with the present invention were evaluated by using the XPS measurement, so that the element contents (mol %) of B (boron), N (nitrogen), and C (carbon) were obtained, and the carbon content [C/(B+N+C)] was found from the measurement results thereof. The carbon content was 40% in Comparative Example 1 in Table 1. In contrast, the carbon content of each of the borazine skeletal structure film formed in accordance with the present invention was low and 35% or less, as shown in Conditions 1 to 15 in Table 1. This indicates that the incorporation of the alkyl groups was successfully suppressed during the film formation.

(3) GIXA (Grazing Incidence X-Ray Analysis) Measurement

Figure 9:
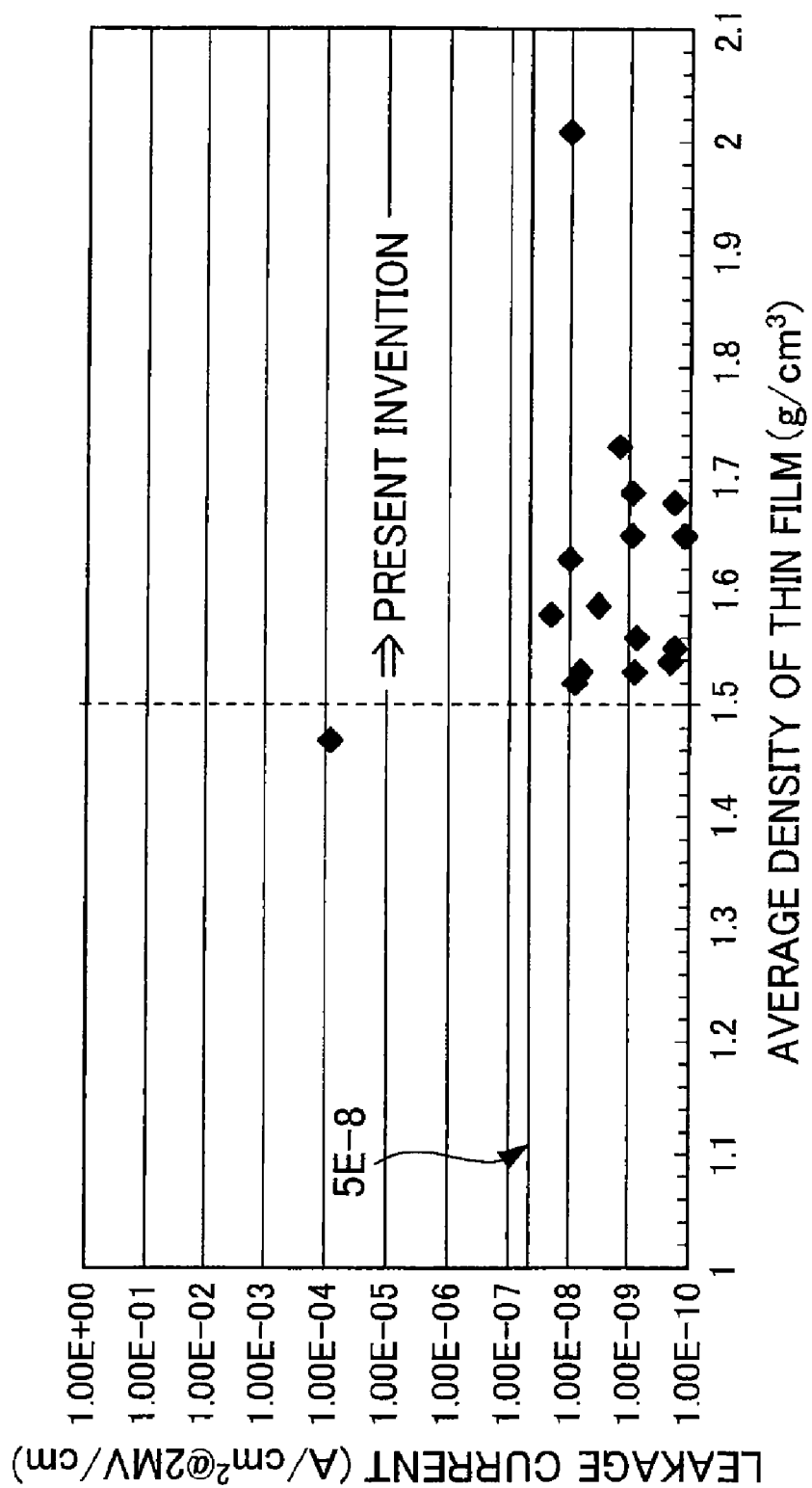
FIG. 9 is a graph showing characteristics of insulating films for a semiconductor device formed by the production process according to the present invention, where density was measured by GIXA measurement, and correlation between the density and leakage current was evaluated.

The GIXA (grazing incidence X-ray analysis) measurement can determine the density of a thin film, and the like by utilizing a phenomenon in which when X-rays are incident on a sample at an extremely shallow angle, total reflection occurs, and the X rays around the critical angle of the total reflection penetrate to a depth of about several nm to several hundreds nm, which is extremely small. For the measurement, X'Pert PRO MRD Philis was used. The borazine skeletal structure film obtained in Comparative Example and the borazine skeletal structure films formed in accordance with the present invention were measured by the GIXA measurement. In addition, the leakage current of each film was measured. In FIG. 9, Comparative Example 1 in Table 1, which represents the borazine skeletal structure film obtained in Comparative Example, is compared with Conditions 1 to 15 in Table 1, which represent the borazine skeletal structure films formed in accordance with the present invention, in terms of density and leakage current.

As can be seen from FIG. 9, in Comparative Example 1, the average density of the thin film was about 1.4 g/cm$^3$, and the leakage current thereof was larger than 5E-8 A/cm$^2$. Accordingly, the thin film did not meet requirement of characteristic for an insulating film. In contrast, in the cases of the present invention, the average density of each thin film was 1.5 g/cm$^3$ or more, and the leakage current was smaller than 5E-8 A/cm$^2$. Accordingly, the thin films met the requirement of characteristics for an insulating film. Incidentally, boron nitride (hBN) itself has a density of 2.2 g/cm$^3$. Accordingly, the upper limit of the density of a borazine skeletal structure film formed in accordance with the present invention is also 2.2 g/cm$^3$. From these results, it can be seen that when the average density was 1.5 g/cm$^3$ or more, the leakage current of the thin film was low. This is because the gas-phase polymerization of the borazine skeletal molecules proceeds sufficiently, so that an ideal cross-linking structure is formed. Here, the mechanical strength is also sufficient.

As described above, the insulating film for a semiconductor device according to the present invention has characteristics of a low permittivity, a low leakage current, and a high mechanical strength, and undergoes less change in these characteristics with the elapse of time. Accordingly, in the production of a semiconductor device such as a CPU, a RAM, or an ASIC, after wiring is formed on a substrate in a wiring forming step, the insulating film for a semiconductor device according to the present invention is formed on the substrate in an insulating film formation step, and placed as an interlayer insulating film between pieces of the wiring. Thereby, a highly integrated and high-speed semiconductor device can be stably obtained.

Here, Table 1 (Conditions 1 to 15 and Comparative Example 1) is shown below.

TABLE 1

| | | CONDITION 1 | CONDITION 2 | CONDITION 3 | CONDITION 4 |
|---|---|---|---|---|---|
| FILM FORMATION PROCESS | RAW MATERIAL (ALKYLBORAZINE) | R1~R6 = $CH_3$ (60 sccm) | R1, R3, R5 = $C_2H_5$ R2, R4, R6 = $CH_3$ (40 sccm) | R1, R3, R5 = $C_2H_5$ R2, R4, R6 = $CH_3$ (50 sccm) | R1, R3, R5 = $C_2H_5$ R2, R4, R6 = $CH_3$ (50 sccm) |
| | RAW MATERIAL (AMINE) | NONE | NONE | NONE | NONE |
| | RATIO OF AMINE COMPOUND ADDED (FLOW RATE OF AMINE COMPOUND/ FLOW RATE OF ALKYLBORAZINE COMPOUND) | 0 | 0 | 0 | 0 |
| | CARRIER GAS | Ar: 200 sccm | Ar: 200 sccm | Ar: 200 sccm | Ar: 200 sccm |
| | RF | 5200 $W/m^2$ | 4200 $W/m^2$ | 4200 $W/m^2$ | 4200 $W/m^2$ |
| | LF | 0 $W/m^2$ | 0 $W/m^2$ | 0 $W/m^2$ | 0 $W/m^2$ |
| | PRESSURE | 30 mTorr | 30 mTorr | 30 mTorr | 30 mTorr |
| | DISTANCE FROM CEILING PLATE | 15 | 24 | 20 | 5 |
| | TEMPERATURE OF SUBSTRATE | 320° C. | 320° C. | 320° C. | 320° C. |
| | TIME | 40 SECONDS | 55 SECONDS | 50 SECONDS | 45 SECONDS |
| REACTION PROMOTING STEP | CARRIER GAS | NONE | NONE | NONE | NONE |
| | RF | | | | |
| | LF | | | | |
| | PRESSURE | | | | |
| | TEMPERATURE OF SUBSTRATE | | | | |
| | TIME | | | | |
| CHARACTERISTICS OF FILM | PERMITTIVITY (VALUE AFTER 2 WEEKS) | 2.55(2.60) | 2.63(2.67) | 2.92(2.96) | 2.97(3.00) |
| | LEAKAGE CURRENT (2 MV/cm) | 6.5E-9 $A/cm^2$ | 8.1E-10 $A/cm^2$ | 2.1E-10 $A/cm^2$ | 2.0E-8 $A/cm^2$ |
| | YOUNG'S MODULUS | 15 GPa | 13 GPa | 21 GPa | 26 GPa |
| EVALUATION OF FILM | IR B1/A | 0.01 | 0.05 | 0.02 | 0.03 |
| | IR B2/A | 0.10 | 0.12 | 0.12 | 0.12 |
| | XPS C/(B + N + C) (%) | 28 | 32 | 30 | 35 |
| | GIXA DENSITY | 1.53 $g/cm^3$ | 1.53 $g/cm^3$ | 1.54 $g/cm^3$ | 1.58 $g/cm^3$ |

| | | CONDITION 5 | CONDITION 6 | CONDITION 7 | CONDITION 8 |
|---|---|---|---|---|---|
| FILM FORMATION PROCESS | RAW MATERIAL (ALKYLBORAZINE) | R1 = H R2~R6 = $CH_3$ (50 sccm) | R1, R3 = H R2, R4~R6 = $C_2H_5$ (50 sccm) | R1, R3, R5 = $C_2H_5$ R2, R4, R6 = $CH_3$ (30 sccm) | R1, R3, R5 = $C_2H_5$ R2, R4, R6 = H (50 sccm) |
| | RAW MATERIAL (AMINE) | NONE | $CH_3NH_2$ (50 sccm) | $(CH_3)_2CHNH_2$ (100 sccm) | $C_2H_5NH_2$ (200 sccm) |
| | RATIO OF AMINE COMPOUND ADDED (FLOW RATE OF AMINE COMPOUND/ FLOW RATE OF ALKYLBORAZINE COMPOUND) | 0 | 1 | 3.3 | 4 |
| | CARRIER GAS | He: 200 sccm | Ar: 200 sccm | Ar: 200 sccm | Ar: 200 sccm |
| | RF | 5200 $W/m^2$ | 3200 $W/m^2$ | 6400 $W/m^2$ | 4200 $W/m^2$ |
| | LF | 0 $W/m^2$ | 0 $W/m^2$ | 0 $W/m^2$ | 0 $W/m^2$ |
| | PRESSURE | 15 mTorr | 30 mTorr | 15 mTorr | 30 mTorr |
| | DISTANCE FROM CEILING PLATE | 20 | 15 | 20 | 20 |
| | TEMPERATURE OF SUBSTRATE | 350° C. | 380° C. | 320° C. | 320° C. |
| | TIME | 50 SECONDS | 50 SECONDS | 65 SECONDS | 50 SECONDS |
| REACTION PROMOTING STEP | CARRIER GAS | NONE | NONE | NONE | NONE |
| | RF | | | | |
| | LF | | | | |
| | PRESSURE | | | | |
| | TEMPERATURE OF SUBSTRATE | | | | |
| | TIME | | | | |
| CHARACTERISTICS OF FILM | PERMITTIVITY (VALUE AFTER 2 WEEKS) | 2.76(2.80) | 2.85(2.89) | 2.63(2.67) | 2.84(2.87) |
| | LEAKAGE CURRENT (2 MV/cm) | 8.2E-9 $A/cm^2$ | 3.5E-9 $A/cm^2$ | 8E-10 $A/cm^2$ | 1.8E-10 $A/cm^2$ |
| | YOUNG'S MODULUS | 19 GPa | 22 GPa | 13 GPa | 20 GPa |
| EVALUATION OF FILM | IR B1/A | 0.02 | 0.02 | 0.01 | 0.01 |
| | IR B2/A | 0.12 | 0.17 | 0.15 | 0.16 |
| | XPS C/(B + N + C) (%) | 33 | 11 | 13 | 14 |

TABLE 1-continued

|  |  | | | | |
|---|---|---|---|---|---|
|  | GIXA DENSITY | 1.52 g/cm³ | 1.59 g/cm³ | 1.56 g/cm³ | 1.55 g/cm³ |
|  |  | CONDITION 9 | CONDITION 10 | CONDITION 11 | CONDITION 12 |
| FILM FORMATION PROCESS | RAW MATERIAL (ALKYLBORAZINE) | R1, R3, R5 = $C_2H_5$ R2, R4, R6 = $CH_3$ (40 sccm) | R1, R3, R5 = $C_2H_5$ R2, R4, R6 = $CH_3$ (20 sccm) | R1~R6 = $CH_3$ (30 sccm) | R1 = H R2~R6 = $CH_3$ (100 sccm) |
|  | RAW MATERIAL (AMINE) | $CH_3NH_2$ (100 sccm) | $C_2H_5NH_2$ (200 sccm) | $CH_3NH_2$ (100 sccm) | $CH_3NH_2$ (100 sccm) |
|  | RATIO OF AMINE COMPOUND ADDED (FLOW RATE OF AMINE COMPOUND/ FLOW RATE OF ALKYLBORAZINE COMPOUND) | 2.5 | 10 | 3.3 | 1 |
|  | CARRIER GAS | Ar: 200 sccm | Ar: 200 sccm | Ar: 200 sccm | N2: 600 sccm |
|  | RF | 6400 W/m² | 4200 W/m² | 6400 W/m² | 4200 W/m² |
|  | LF | 4200 W/m² | 7300 W/m² | 7300 W/m² | 7300 W/m² |
|  | PRESSURE | 15 mTorr | 30 mTorr | 30 mTorr | 30 mTorr |
|  | DISTANCE FROM CEILING PLATE | 20 | 24 | 15 | 20 |
|  | TEMPERATURE OF SUBSTRATE | 320° C. | 300° C. | 320° C. | 320° C. |
|  | TIME | 60 SECONDS | 90 SECONDS | 70 SECONDS | 35 SECONDS |
| REACTION PROMOTING STEP | CARRIER GAS | NONE | NONE | Ar: 500 sccm | Ar: 500 sccm |
|  | RF |  |  | 37500 W/m² | 37500 W/m² |
|  | LF |  |  | 31900 W/m² | 9500 W/m² |
|  | PRESSURE |  |  | 10 mTorr | 20 mTorr |
|  | TEMPERATURE OF SUBSTRATE |  |  | 400° C. | 380° C. |
|  | TIME |  |  | 60 SECONDS | 60 SECONDS |
| CHARACTERISTICS OF FILM | PERMITTIVITY (VALUE AFTER 2 WEEKS) | 3.35(3.40) | 3.25(3.29) | 3.30(3.30) | 2.83(2.83) |
|  | LEAKAGE CURRENT (2 MV/cm) | 1.5E-9 A/cm² | 1.9E-10 A/cm² | 9.8E-9 A/cm² | 8.6E-10 A/cm² |
|  | YOUNG'S MODULUS | 109 GPa | 114 GPa | 130 GPa | 60 GPa |
| EVALUATION OF FILM | IR B1/A | 0.01 | 0.01 | 0.01 | 0.01 |
|  | IR B2/A | 0.13 | 0.19 | 0.19 | 0.18 |
|  | XPS C/(B + N + C) (%) | 25 | 12 | 15 | 14 |
|  | GIXA DENSITY | 1.73 g/cm³ | 1.68 g/cm3 | 2.01 g/cm³ | 1.65 g/cm³ |
|  |  | CONDITION 13 | CONDITION 14 | CONDITION 15 | COMPARATIVE EXAMPLE 1 |
| FILM FORMATION PROCESS | RAW MATERIAL (ALKYLBORAZINE) | R1, R3, R5 = $C_2H_5$ R2, R4, R6 = $CH_3$ (30 sccm) | R1, R3, R5 = H R2, R4, R6 = $CH_3$ (40 sccm) | R1, R3, R5 = $C_2H_5$ R2, R4, R6 = H (100 sccm) | R1, R3, R5 = $C_2H_5$ R2, R4, R6 = $CH_3$ (50 sccm) |
|  | RAW MATERIAL (AMINE) | $C_2H_5NH_2$ (540 sccm) | $NH_3$ (240 sccm) | $(CH_3)_2CHNH_2$ (100 sccm) | NONE |
|  | RATIO OF AMINE COMPOUND ADDED (FLOW RATE OF AMINE COMPOUND/ FLOW RATE OF ALKYLBORAZINE COMPOUND) | 18 | 6 | 1 | 0 |
|  | CARRIER GAS | Ar: 200 sccm | He: 300 sccm | He: 200 sccm | Ar: 200 sccm |
|  | RF | 1600 W/m² | 3200 W/m² | 5200 W/m² | 4200 W/m² |
|  | LF | 700 W/m² | 2600 W/m² | 1000 W/m² | 0 W/m² |
|  | PRESSURE | 10 mTorr | 20 mTorr | 30 mTorr | 30 mTorr |
|  | DISTANCE FROM CEILING PLATE | 20 | 11 | 25 | 3 |
|  | TEMPERATURE OF SUBSTRATE | 320° C. | 280° C. | 350° C. | 320° C. |
|  | TIME | 65 SECONDS | 60 SECONDS | 35 SECONDS | 50 SECONDS |
| REACTION PROMOTING STEP | CARRIER GAS | Ar: 500 sccm | He: 900 sccm | He: 600 sccm | NONE |
|  | RF | 47600 W/m² | 47600 W/m² | 37500 W/m² |  |
|  | LF | 9500 W/m² | 9500 W/m² | 5300 W/m² |  |
|  | PRESSURE | 20 mTorr | 20 mTorr | 50 mTorr |  |
|  | TEMPERATURE OF SUBSTRATE | 380° C. | 280° C. | 350° C. |  |
|  | TIME | 60 SECONDS | 120 SECONDS | 120 SECONDS |  |

TABLE 1-continued

| CHARACTER-ISTICS OF FILM | PERMITTIVITY (VALUE AFTER 2 WEEKS) | 2.52(2.53) | 2.95(2.95) | 2.76(2.77) | 2.98(3.18) |
|---|---|---|---|---|---|
| | LEAKAGE CURRENT (2 MV/cm) | 9.5E−9 A/cm$^2$ | 1.2E−10 A/cm$^2$ | 8.2E−10 A/cm$^2$ | 8.2E−5 A/cm$^2$ |
| | YOUNG'S MODULUS | 25 GPa | 30 GPa | 19 GPa | 14 GPa |
| EVALUATION OF FILM | IR B1/A | 0.01 | 0.01 | 0.01 | 0.07 |
| | IR B2/A | 0.18 | 0.16 | 0.12 | 0.07 |
| | XPS C/(B + N + C) (%) | 12 | 11 | 15 | 40 |
| | GIXA DENSITY | 1.63 g/cm$^3$ | 1.65 g/cm$^3$ | 1.69 g/cm$^3$ | 1.47 g/cm$^3$ |

INDUSTRIAL APPLICABILITY

The insulating film for a semiconductor device according to the present invention is suitable as an interlayer insulating film for a semiconductor device. The insulating film for a semiconductor device according to the present invention is also applicable as a copper diffusion preventing film, an etch stopper layer, a passivation film, a hard mask, a high-stress film, or the like for a semiconductor device.

The invention claimed is:

1. A process for producing an insulating film for a semiconductor device, comprising:
  supplying a gas containing a raw material gas obtained by gasifying an alkylborazine compound represented by the following chemical formula 1 into a chamber;
  causing plasma generating means of an inductively coupled type to radiate electromagnetic waves into the chamber, thereby converting the gas into a plasma state, wherein the plasma generating means radiates the electromagnetic wave into the chamber from an antenna placed immediately above a ceiling plate of the chamber;
  placing a substrate in a plasma diffusion region of the plasma and at a position at which a distance from a lower surface of the ceiling plate is 5 cm to 30 cm; and
  performing gas-phase polymerization by using, as fundamental units, borazine skeletal molecules dissociated from the alkylborazine compound by the plasma, thereby forming a film on the substrate as the insulating film for a semiconductor device:

[Chemical Formula 1]

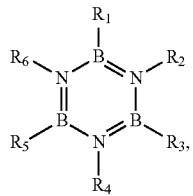

where R1 to R6 in the above chemical formula 1 are each a hydrogen atom or an alkyl group having 5 carbon atoms or less, and may be the same or different, except in a case where all R1 to R6 are hydrogen atoms.

2. The process for producing an insulating film for a semiconductor device according to claim 1, wherein
  at least one of R1, R3, and R5 in the alkylborazine compound shown in the above chemical formula 1 is a hydrogen atom.

3. The process for producing an insulating film for a semiconductor device according to claim 1, wherein
  the substrate is placed in a region where an electron temperature is 3.5 eV or less.

4. The process for producing an insulating film for a semiconductor device according to claim 1, wherein
  a gas containing at least one selected from the group consisting of ammonia and amine compounds each having an alkyl group having 1 to 3 carbon atoms is supplied into the chamber, along with the alkylborazine compound.

5. The process for producing an insulating film for a semiconductor device according to claim 1, wherein
  after the insulating film for a semiconductor device is formed, the formed insulating film for a semiconductor device is treated with plasma mainly made from a gas not containing the alkylborazine compound.

6. The process for producing an insulating film for a semiconductor device according to claim 1, wherein
  a bias is applied to the substrate.

7. The process for producing an insulating film for a semiconductor device according to claim 1, wherein
  the temperature of the substrate is set to 150° C. to 700° C., both inclusive.

8. A process for producing a semiconductor device, comprising;
  a wiring forming step of forming wiring on a substrate; and
  an insulating film forming step of forming an insulating film on the substrate by using the process for producing an insulating film for a semiconductor device according to claim 1.

9. An insulating film for a semiconductor device, wherein
  the insulating film is formed by using the process for producing an insulating film for a semiconductor device according to claim 1.

10. The insulating film for a semiconductor device according to claim 9, wherein
  in infrared absorption measurement, a ratio [B1/A] is 0.05 or less, where A represents an absorption intensity at wave numbers of 1250 to 1450 cm$^{-1}$, and B1 represents an absorption intensity at wave numbers of 2400 to 2600 cm$^{-1}$.

11. The insulating film for a semiconductor device according to claim 9, wherein
  in infrared absorption measurement, a ratio [B2/A] is 0.1 or more, where A represents an absorption intensity at wave numbers of 1250 to 1450 cm$^{-1}$, and B2 represents an absorption intensity at wave numbers of 760 to 800 cm$^{-1}$.

12. The insulating film for a semiconductor device according to claim 9, wherein
  in X-ray photoelectron spectroscopy, a ratio [C/(B+N+C)] is 35% or less, the ratio [C/(B+N+C)] being a ratio of a content of carbon atoms C with respect to a sum of contents of boron atoms B, nitrogen atoms N and carbon atoms C, of constituent elements in the film.

13. The insulating film for a semiconductor device according to claim 9, wherein
  in grazing incidence X-ray analysis, an average density of the film is 1.5 g/cm$^3$ to 2.2 g/cm$^3$, both inclusive.

14. A semiconductor device comprising:
  the insulating film for a semiconductor device according to claim 9 used therein.

* * * * *